(12) United States Patent
Pan et al.

(10) Patent No.: US 10,356,949 B2
(45) Date of Patent: Jul. 16, 2019

(54) SERVER RACK HEAT SINK SYSTEM WITH COMBINATION OF LIQUID COOLING DEVICE AND AUXILIARY HEAT SINK DEVICE

(71) Applicant: GUANGDONG SHENLING ENVIRONMENTAL SYSTEMS CO., LTD., Guangdong (CN)

(72) Inventors: Zhanhua Pan, Guangdong (CN); Minhua Li, Guangdong (CN); Hua Chen, Guangdong (CN); Chunhui Xie, Guangdong (CN); Ti Ouyang, Guangdong (CN); Xuewei Zhang, Guangdong (CN); Yuqun Qiu, Guangdong (CN)

(73) Assignee: GUANGDONG SHENLING ENVIRONMENTAL SYSTEMS CO., LTD., Guangdong (CN)

( * ) Notice: Subject to any disclaimer, the term of this patent is extended or adjusted under 35 U.S.C. 154(b) by 0 days.

(21) Appl. No.: 15/547,350

(22) PCT Filed: May 5, 2015

(86) PCT No.: PCT/CN2015/078306
§ 371 (c)(1),
(2) Date: Jul. 28, 2017

(87) PCT Pub. No.: WO2016/155081
PCT Pub. Date: Oct. 6, 2016

(65) Prior Publication Data
US 2018/0042140 A1     Feb. 8, 2018

(30) Foreign Application Priority Data
Mar. 31, 2015    (CN) .......................... 2015 1 0144650

(51) Int. Cl.
*H05K 7/20*          (2006.01)

(52) U.S. Cl.
CPC ....... *H05K 7/20636* (2013.01); *H05K 7/2079* (2013.01); *H05K 7/20309* (2013.01);
(Continued)

(58) Field of Classification Search
CPC ................................................. H05K 7/20636
See application file for complete search history.

(56) References Cited

U.S. PATENT DOCUMENTS

2006/0011152 A1*   1/2006   Hayes ....................... F01P 3/18
                                                                         123/41.49
2009/0044929 A1*   2/2009   Yeh ..................... F28D 1/05391
                                                                         165/104.19
(Continued)

FOREIGN PATENT DOCUMENTS

CN           2512023 Y      9/2002
CN           2657201 Y     11/2004
(Continued)

*Primary Examiner* — David M Sinclair
*Assistant Examiner* — Robert D Brown
(74) *Attorney, Agent, or Firm* — Muncy, Geissler, Olds & Lowe, P.C.

(57) ABSTRACT

A server heat dissipation system is provided, comprising a liquid cooling server cabinet comprising a cabinet body and multiple liquid cooling servers provided inside the cabinet body, wherein it is provided with a liquid cooling device to perform direct liquid cooling to the liquid cooling servers, and with an auxiliary heat dissipation device to perform auxiliary heat dissipation to the liquid cooling servers. The present invention provides high density cooling, high heat exchange efficiency, no local overheating, small space occupied, high reliability, low noise, and long life.

11 Claims, 9 Drawing Sheets

(52) U.S. Cl.
CPC ..... *H05K 7/20318* (2013.01); *H05K 7/20327* (2013.01); *H05K 7/20681* (2013.01); *H05K 7/20736* (2013.01); *H05K 7/20772* (2013.01); *H05K 7/20781* (2013.01); *Y02D 10/16* (2018.01)

(56) References Cited

U.S. PATENT DOCUMENTS

| | | | | |
|---|---|---|---|---|
| 2010/0101759 A1* | 4/2010 | Campbell | .......... | H05K 7/20772 165/80.4 |
| 2010/0101765 A1* | 4/2010 | Campbell | .......... | H05K 7/20809 165/104.33 |
| 2010/0103618 A1* | 4/2010 | Campbell | .......... | H05K 7/20236 361/699 |
| 2010/0126696 A1* | 5/2010 | Novotny | ............ | H05K 7/20709 165/67 |
| 2012/0180979 A1* | 7/2012 | Harrington | ........... | F28D 1/0246 165/11.1 |
| 2014/0085821 A1* | 3/2014 | Regimbal | .......... | H05K 7/20236 361/699 |
| 2014/0133099 A1* | 5/2014 | Campbell | ................. | F28F 9/00 361/698 |
| 2014/0202678 A1* | 7/2014 | Goth | ................... | H05K 7/20772 165/287 |
| 2015/0109728 A1* | 4/2015 | Campbell | .......... | H05K 7/20236 361/679.47 |
| 2015/0109735 A1* | 4/2015 | Campbell | .......... | H05K 7/20318 361/700 |
| 2016/0313747 A1* | 10/2016 | Meijer | ................... | G05D 22/02 |
| 2017/0049009 A1* | 2/2017 | Steinke | ............. | H05K 7/20781 |
| 2017/0127576 A1* | 5/2017 | Campbell | .......... | H05K 7/20781 |
| 2017/0181325 A1* | 6/2017 | Shelnutt | .......... | H05K 7/20781 |
| 2017/0367217 A1* | 12/2017 | Xiao | ................... | H05K 7/20272 |
| 2018/0092254 A1* | 3/2018 | Shelnutt | .......... | H05K 7/20781 |

FOREIGN PATENT DOCUMENTS

| | | |
|---|---|---|
| CN | 202585391 U | 12/2012 |
| TW | 200922448 A | 5/2009 |

* cited by examiner

SERVER RACK HEAT SINK SYSTEM WITH COMBINATION OF LIQUID COOLING DEVICE AND AUXILIARY HEAT SINK DEVICE

FIELD OF THE INVENTION

The present invention relates to a heat dissipation system for server cabinet, and in particular to a server heat dissipation system comprising a liquid cooling device in combination with an auxiliary heat dissipation device.

BACKGROUND OF THE INVENTION

As continuing increase of high density cabinets in the IDC internet data center room, devices' integration level increases, and so does their processing ability. However, power consumption of the devices also increases, resulting in more heat generated by the devices inside the cabinet. According to statistics, current cabinet servers in huge IDC rooms produce a lot of heat and basically operate 8760 h for a whole year. For a room that does not utilize fresh air, cooling is required for the whole year, which results in a huge power consumption by the air conditioning system, which accounts for about 40%-50% of the total power consumption in the data room.

Conventional ways for air supply in a data room comprise air supply through an air passage in the bottom plate, air supply through separated hot and cold passages, and air supply by cooling in the whole room. However, this mode can no longer meet the cooling requirement for high density cabinets in a modernized computer room, and causes problems related to local overheating, high power consumption, and too high energy consumption by air conditioners in the room, and loud noise. In the meantime, precise air conditioning in the room requires repeated humidification and dehumidification operations, or providing a specialized dehumidifier to perform humidity and dew-point control in the room, so as to ensure that no condensation occurs inside the devices, which results in decrease in efficiency of the air conditioning system, and increase in power consumption. If the heat dissipation problem is not well solved, safety operation of the devices in the room will be greatly affected. Therefore, it is important in the air conditioning industry and in the data room operating industry how to effectively reduce power consumption of the air conditioning system inside the computer room while meeting requirements of devices.

From the energy saving view, currently there exists a solution where outdoor air is directly introduced indoor for cooling the room. This solution provides advantages of high cooling efficiency, low initial investment and low power consumption. However, the introduction of outdoor cold air makes it hard to ensure the cleanliness and humidity of the indoor air, which brings safety risks and requires lots of maintenance in future operations. In addition, there also exists a solution where air-air cellular heat exchanger is used to indirectly exchange heat between hot air in hot pipes and outdoor cold air, so as to reduce temperature inside the room. Its advantage is that no outdoor air is introduced when using an outdoor cold source, which does not affect the cleanliness and humidity of the air inside the room. However, its disadvantage is that it requires relatively high initial investment, complex structures for the heat exchanger, is easy to be blocked, and requires regular cleaning and lots of maintenance.

As the development of server techniques, servers with high power and high heat density are being more and more utilized. This development is irreversible. Currently, the maximum operating power of a single cabinet of some of the users in this industry has reached about 10-15 kW. However, due to the limitation in heat dissipation efficiency of air cooling, it is hard for a high power server to be utilized under more than 15 kW per cabinet.

Liquid heat dissipation is a heat dissipation solution developed in recent years which is most efficient and most advanced. Its principle is to introduce a liquid heat exchange medium directly into a server with liquid cooling function, and carries out the heat generated by the main heat generating element—the chip (CPU) which accounts for 70-80% of the total heat generated in the server. A liquid heat dissipation solution theoretically provides a power per cabinet of even more than 50 kW.

However, this heat dissipation solution currently only exists in university laboratories and very few corporations for internal small-scale study, and has not yet been practicalized. One of the main reasons is that this kind of servers for liquid heat dissipation requires a liquid distributing system inside its cabinet, which requires specialized custom designing for the server cabinet. However, cabinet manufactures normally only provide standardized production, and have not mastered key technologies related to designing for a liquid distributing system, therefore, they cannot provide server users with a cabinet having inside a liquid distributing system. Especially for the upgrade of old computer rooms, in order to utilize a liquid heat dissipation solution, all the cabinets have to be replaced with cabinets having a liquid distributing system, which requires a very large amount of work and a very high cost, greatly affecting the development and popularization of liquid cooling technique.

In addition, only 70-80% of the heat in the server can be taken out by the liquid cooling system, remaining 20-30% of the heat to be handled by an auxiliary cooling device. For a high density application in a liquid cooling server having a power up to 50 kW per cabinet, each cabinet requires the auxiliary cooling device to handle more than 10-15 kW heat (20-30% of the total power). If traditional air cooling is still used in the auxiliary cooling device, local overheating may occur very easily in the cabinet, affecting the life of the elements in the server, which is also a problem that cannot be ignored in the development and popularization of high density liquid cooling servers.

A server cabinet has been disclosed by the Chinese application No. 201010261284.1 with the title of "Server cabinet and liquid cooling system thereof", which comprises a housing, a server provided inside the housing, and a liquid cooling system. The housing is provided with a heat conducting plate adjacent to the server. The liquid cooling system comprises a refrigerator outside the housing, and a pipe thermally connecting the heat conducting plate with the refrigerator. Heat generated due to operation of the server forms a heat flow in the housing which is cooled at the heat conducting plate. The pipe extends outside the housing and is respective connected with two opposite ends of the refrigerator, so as to transfer the heat absorbed from the server by the heat conducting plate to the refrigerator to perform heat exchanging. Although liquid heat dissipation is also used in this patent application, the heat in the server cannot entirely be taken out by the liquid cooling system. Therefore, there still exist problems such as local overheating and short life.

A server cabinet cooling system has been disclosed by the Chinese application No. 201210545675.5 with the title of "A server cabinet cooling system", which comprises a liquid cooling box provided inside the cabinet, a water cooling device inside the cabinet, an air cooling device inside the cabinet, first liquid reservoir, and an outer cooling system. The liquid cooling box comprises a fin heat exchanger, a plate heat exchanger and a first pump integrated inside one box. The hot water side of the plate heat exchanger, the first pump, the first liquid reservoir, and the water cooling device are connected to form a first circulation loop by a pipe. The outer cooling system, the air cooling device, the fin heat exchanger, and the plate heat exchanger are connected to form a second circulation loop by a pipe. In this patent application, the heat of the first circulation loop is taken away by the second circulation loop. However, the cooling device in the first circulation loop performs heat conduction to the air inside the whole cabinet, instead of performing heat conduction directly to the heat generating chips in the server, which results in a low cooling efficiency and poor effect. In addition, the first circulation loop is provided with the first pump which generates much heat during its operation. Thus a specialized heat exchanger is required to transfer the heat accumulated during operation of the first pump, which undoubtedly brings a burden to the system and thus further reduces the cooling efficiency of the system.

A control method of a server cabinet cooling system with a hot pipe secondary refrigerant circulation loop has been disclosed by the Chinese application No. 201410511550.X with the title of "A control method of a server cabinet cooling system with a hot pipe secondary refrigerant circulation loop", which comprises a room unit, a refrigerant supplying and returning unit, and a controlling system. The refrigerant supplying and returning system comprises a cooling unit and a circulating power unit, wherein the circulating power unit is connected with the room unit by a water supplying pipe or a water returning pie and connected with the cooling unit by an outdoor air outlet pipe or an outdoor liquid returning pipe, and the cooling unit and the circulating power unit are both connected with the controlling system. The room unit comprises a cabinet, one or more cooling fans, multiple servers, multiple hot pipe heat dissipaters, and multiple hot pipe heat exchange devices. The cooling fans, the servers, the hot pipe heat dissipaters and the hot pipe heat exchange devices are all arranged inside the cabinet, wherein the hot pipe heat dissipaters are closely attached on the servers, the hot pipe heat exchange devices are connected with the hot pipe heat dissipaters, the hot pipe heat exchange devices are connected with the water supplying pipe of the cabinet by a water supplying pipe and connected with the water returning pipe of the cabinet by a water returning pipe. In this patent application, the hot pipe heat dissipaters are only attached on the servers, and are not directing cooling main heat generating elements. In addition, heat exchange between the two circulation loops is performed by an intermediate heat exchanger in this system, which certainly results in a heat transfer efficiency lower than that in direct heat exchange. In addition, only heat dissipation for main heat generating elements (CPU) are considered in this patent application, but heat dissipation for other heat generating elements (such as memory and hard disk) are not considered. Therefore, the heat dissipation solution provided in this patent application is not enough.

SUMMARY OF THE INVENTION

An object of the present invention is to overcome one of the above deficiencies in the art and provide a server heat dissipation system comprising a liquid cooling device in combination with an auxiliary heat dissipation device, which provides high cooling efficiency and good effect, causes no local overheating, and requires no reconstruction to the cabinet.

This and other objects and advantages of the present invention are achieved by the solutions described herein after.

A server heat dissipation system is provided, comprising a liquid cooling server cabinet comprising a cabinet body and multiple liquid cooling servers provided inside the cabinet body. The system is provided with a liquid cooling device to perform direct liquid cooling to the liquid cooling servers, and with an auxiliary heat dissipation device to perform auxiliary heat dissipation to the liquid cooling servers. In the present invention, liquid heat dissipation technique is used to perform main cooling, and main cooling and auxiliary cooling cooperate with each other. On one hand, this provides high cooling efficiency and good effect, and does not cause local overheating. On the other hand, it does not require reconstruction to the cabinet, which makes it possible to widely utilize liquid heat dissipation technique.

One solution provides that the liquid cooling device comprises a liquid heat dissipater, a distributor, a collector, and a primary heat transfer medium. The liquid heat dissipater is provided for performing heat dissipation to server chips, the distributor is connected with the liquid heat dissipater by a plurality of liquid inlet pipes, and the liquid heat dissipater is then connected with the collector by a plurality of liquid outlet pipes. The primary heat transfer medium flows into the liquid heat dissipater through the distributor and the liquid inlet pipes, and then flows out from the liquid heat dissipater through the liquid outlet pipes, and then is collected by the collector. The primary heat transfer medium flows from the distributor into the liquid heat dissipater through the liquid inlet pipes, and then flows into the collector through the liquid outlet pipes, thereby forming a circulation loop to carry out the heat in the server.

Further, the liquid cooling device can be externally installed on the cabinet body fixedly or movably, preferably movably.

The primary heat transfer medium can be tap water, purified water, an organic solution, an inorganic solution, or Freon, preferably purified water. The liquid inlet pipes and the liquid outlet pipes can be hard pipes or soft pipes, preferably soft pipes.

The liquid heat dissipater can be provided adjacent to the server chips, or in direct connection with the server chips.

The auxiliary heat dissipation device can be a door-type cold water heat exchange device comprising a cold water heat exchanger, a connecting pipe, and a secondary heat transfer medium. The cold water heat exchanger is arranged on the liquid cooling server cabinet or the liquid cooling device, and the secondary heat transfer medium is carried by the connecting pipe. Specifically, the cold water heat exchanger can be installed at a front door side or back door side of the cabinet body, preferably on the back door side. A heat exchanger with aluminum micro-channels or a heat exchanger with a copper pipe surrounded by aluminum fins can be used, preferably the latter. In addition, the cold water heat exchanger can be opened by rotating around a shaft, and water inlet pipe and water outlet pipe of the cold water heat exchanger can both be soft pipes.

Further, the door-type cold water heat exchange device further comprises a fan installed at an air outlet side of the cold water heat exchanger. The fan can be a centrifugal fan, an axial flow fan, or a mixed flow fan, preferably an axial flow fan.

Furthermore, the door-type cold water heat exchange device further comprises a chiller and a pump, both provided outside the computer room and connected with the cold water heat exchanger by the connecting pipe.

The secondary heat transfer medium is carried from the chiller to the cold water heat exchanger by the pump, and then flows from the cold water heat exchanger back to the chiller, thereby forming a circulation loop to take away part of the heat. The secondary heat transfer medium can be water or an antifreeze solution.

During operation of this system, heat generated by chips in the liquid cooling server that accounts for 80% of the total heat is absorbed by the liquid heat dissipater, and is taken away by the primary heat transfer medium flowing through the liquid heat dissipater and having the temperature of about 35-45° C., keeping the temperature inside the liquid cooling server of 60-70° C. to provide a normal operation status. Flow distribution and collection of the primary heat transfer medium of the liquid heat dissipater inside each liquid cooling server are all accomplished by the liquid cooling device. The primary heat transfer medium having the temperature of about 35-45° C. flows from a liquid supplying main pipe into the distributor, and then flows into the liquid heat dissipater by the liquid inlet pipes to absorb heat of the server chips, after which it becomes 40-50° C. and then flows into the collector by the liquid outlet pipes, and flows back to a liquid collecting main pipe.

Heat generated by other elements in the liquid cooling server that accounts for about 20% of the total heat is taken away by air flow generated by a fan in the server itself or in the door-type cold water heat exchange device. Heat in the air flow is absorbed by the secondary heat transfer medium flowing through the cold water heat exchanger of the door-type cold water heat exchange device and having the temperature of 15-20° C., allowing the air flow be cooled to about 20-25° C. again and then flow again into the server to take away heat generated by inner elements of the server, and so the cycle repeats. The secondary heat transfer medium inside the cold water heat exchanger having a temperature of 12-15° C. absorbs heat and becomes 17-20° C., and then flows into the chiller under the circulating power of the pump to be cooled to 12-15° C. again and then flows again into the cold water heat exchanger, and so the cycle repeats.

One solution provides that the liquid cooling device comprises a liquid heat dissipater, a distributor, a collector, and a primary heat transfer medium. The liquid heat dissipater is provided for performing heat dissipation to server chips, the distributor is connected with the liquid heat dissipater by a plurality of liquid inlet pipes, and the liquid heat dissipater is then connected with the collector by a plurality of liquid outlet pipes. The primary heat transfer medium flows into the liquid heat dissipater through the distributor and the liquid inlet pipes, and then flows out from the liquid heat dissipater through the liquid outlet pipes, and then is collected by the collector. The primary heat transfer medium flows from the distributor into the liquid heat dissipater through the liquid inlet pipes, and then flows into the collector through the liquid outlet pipes, thereby forming a circulation loop to take away main heat in the server.

Further, the liquid cooling device can be externally installed on the cabinet body fixedly or movably, preferably movably.

The primary heat transfer medium can be tap water, purified water, an organic solution, an inorganic solution, or Freon, preferably purified water.

The liquid heat dissipater can be provided adjacent to the server chips, or in direct connection with the server chips.

The auxiliary heat dissipation device can be a natural-cooling cold water device comprising a cold water heat exchanger provided on the liquid cooling device, a pump, an electrically adjusting valve, a water-circulating natural-cooling heat exchange device, a chiller, a connecting pipe, and a secondary heat transfer medium. The chiller is connected with the cold water heat exchanger by the connecting pipe to form a circulation loop, and the secondary heat transfer medium is carried by the connecting pipe. The secondary heat transfer medium flows from the chiller into the door-type cold water heat exchanger by the inlet connecting pipe to absorb heat, after which it flows under the driving of the pump into the water-circulating natural-cooling cold water device and the chiller, thereby forming a circulation loop. The secondary heat transfer medium can be water or an antifreeze solution.

Further, the water-circulating natural-cooling heat exchange device may comprise an axial flow fan and a natural-cooling heat exchange coiled pipe. The natural-cooling heat exchange coiled pipe can be connected in series or parallel on the connecting pipe.

Specifically, in one condition, the connecting pipe comprises a water inlet pipe and a water outlet pipe. The pump, the electrically adjusting valve and the water-circulating natural-cooling heat exchange device are successively connected in series on the water outlet pipe. The water-circulating natural-cooling heat exchange device comprises an axial flow fan and a natural-cooling heat exchange coiled pipe. The natural-cooling heat exchange coiled pipe is connected in series on the water inlet pipe. In another condition, the water-circulating natural-cooling heat exchange device comprises an axial flow fan and a natural-cooling heat exchange coiled pipe. The natural-cooling heat exchange coiled pipe is connected parallel on two ends of the chiller, with one end connected with the electrically adjusting valve and the other end connected with the outlet connecting pipe. The electrically adjusting valve is proved at a water outlet of the water-circulating natural-cooling heat exchange device. Comparing these two conditions, the series connection condition is preferred, since it can provide a longer natural-cooling operating time and more significant energy saving effect.

Furthermore, the door-type cold water heat exchange device further comprises a fan installed at an air outlet side of the cold water heat exchanger.

The door-type cold water heat exchanger of the natural-cooling cold water device can be installed at a front door side or back door side of the cabinet body, preferably on the back door side. The door-type cold water heat exchanger of the natural-cooling cold water device can be opened by rotating around a shaft, and water inlet pipe and water outlet pipe of the door-type cold water heat exchanger can both be soft pipes.

The electrically adjusting valve of the natural-cooling cold water device can be a two-way valve or a three-way valve, preferably a three-way valve.

When the water-circulating natural-cooling heat exchange device is connected in series on the connecting pipe, the cooling system operates in the following way.

01) When environment temperature is above 20° C., the chiller is activated, and the water-circulating natural-cooling heat exchange device is stopped. The bypass of the electrically adjusting valve is 0% opened, and the secondary heat transfer medium does not flow through the water-circulating natural-cooling heat exchange device. The axial flow fan is also stopped. All the cooling capacity of the secondary heat transfer medium is provided by the chiller;

02) When environment temperature is 0-20° C., the chiller and the water-circulating natural-cooling heat exchange device are both activated. The bypass of the electrically adjusting valve is 100% opened, and all the secondary heat transfer medium first flows through the water-circulating natural-cooling heat exchange device, where the secondary heat transfer medium is pre-cooled by forced-convection heat transfer of the axial flow fan and the natural-cooling heat exchange coiled pipe, and then flows through the chiller to perform compensated cooling to reach the required temperature;

03) When environment temperature is below 0° C., the chiller is stopped, and the water-circulating natural-cooling heat exchange device is activated. The bypass of the electrically adjusting valve is firstly 100% opened, and all the secondary heat transfer medium first flows through the water-circulating natural-cooling heat exchange device, and the cooling capacity generated by natural-cooling is adjusted by adjusting the rotation rate of the axial flow fan in the following way: when the outlet temperature of the secondary heat transfer medium is below 8° C., the rotation rate of the axial flow fan is reduced, thereby increasing the outlet temperature of the secondary heat transfer medium; when the outlet temperature of the secondary heat transfer medium is above 12° C., the rotation rate of the axial flow fan is increased, thereby reducing the outlet temperature of the secondary heat transfer medium; when the outlet temperature of the secondary heat transfer medium is between 8-12° C., the rotation rate of the axial flow fan is kept constant. The outlet temperature of the secondary heat transfer medium is adjusted by the axial flow fan to be kept in a suitable range, optimally between 8-12° C.;

04) When environment temperature is extremely low, the axial flow fan is already working at its minimal rotation rate, however the cooling capacity generated by natural-cooling is still too high, i.e., the outlet temperature of the secondary heat transfer medium is below 12° C., then the axial flow fan is kept stably working at its minimal rotation rate, and the cooling capacity generated by natural-cooling is adjusted by adjusting the opening of the bypass of the electrically adjusting valve in the following way: when the outlet temperature of the secondary heat transfer medium is below 8° C., the opening of the bypass of the electrically adjusting valve is reduced, thereby increasing the outlet temperature of the secondary heat transfer medium; when the outlet temperature of the secondary heat transfer medium is above 12° C., the opening of the bypass of the electrically adjusting valve is increased, thereby reducing the outlet temperature of the secondary heat transfer medium; when the outlet temperature of the secondary heat transfer medium is between 8-12° C., the opening of the bypass of the electrically adjusting valve is kept constant. The outlet temperature of the secondary heat transfer medium is adjusted by the electrically adjusting valve to be kept in a suitable range, optimally between 8-12° C.

When the water-circulating natural-cooling heat exchange device is connected in parallel on the connecting pipe, the cooling system operates in the following way.

11) When environment temperature is above 0° C., the chiller is activated, and the water-circulating natural-cooling heat exchange device is stopped. The bypass of the electrically adjusting valve is 0% opened, and the secondary heat transfer medium does not flow through the water-circulating natural-cooling heat exchange device. The axial flow fan is also stopped. All the cooling capacity of the secondary heat transfer medium is provided by the chiller;

12) When environment temperature is below 0° C., the chiller is stopped, and the water-circulating natural-cooling heat exchange device is activated. The bypass of the electrically adjusting valve is firstly 100% opened, and all the secondary heat transfer medium first flows through the water-circulating natural-cooling heat exchange device, and the cooling capacity generated by natural-cooling is adjusted by adjusting the rotation rate of the axial flow fan in the following way: when the outlet temperature of the secondary heat transfer medium is below 8° C., the rotation rate of the axial flow fan is reduced, thereby increasing the outlet temperature of the secondary heat transfer medium; when the outlet temperature of the secondary heat transfer medium is above 12° C., the rotation rate of the axial flow fan is increased, thereby reducing the outlet temperature of the secondary heat transfer medium; when the outlet temperature of the secondary heat transfer medium is between 8-12° C., the rotation rate of the axial flow fan is kept constant. The outlet temperature of the secondary heat transfer medium is adjusted by the axial flow fan to be kept in a suitable range, optimally between 8-12° C.;

13) When environment temperature is extremely low, the axial flow fan is already working at its minimal rotation rate, however the cooling capacity generated by natural-cooling is still too high, i.e., the outlet temperature of the secondary heat transfer medium is below 12° C., then the axial flow fan is kept stably working at its minimal rotation rate, and the cooling capacity generated by natural-cooling is adjusted by adjusting the opening of the bypass of the electrically adjusting valve in the following way: when the outlet temperature of the secondary heat transfer medium is below 8° C., the opening of the bypass of the electrically adjusting valve is reduced, thereby increasing the outlet temperature of the secondary heat transfer medium; when the outlet temperature of the secondary heat transfer medium is above 12° C., the opening of the bypass of the electrically adjusting valve is increased, thereby reducing the outlet temperature of the secondary heat transfer medium; when the outlet temperature of the secondary heat transfer medium is between 8-12° C., the opening of the bypass of the electrically adjusting valve is kept constant. The outlet temperature of the secondary heat transfer medium is adjusted by the electrically adjusting valve to be kept in a suitable range, optimally between 8-12° C.

One solution provides that the liquid cooling device comprises a liquid heat dissipater, a distributor, a collector, and a liquid cooling heat transfer medium. The liquid heat dissipater is provided for performing heat dissipation to server chips, the distributor is connected with the liquid heat dissipater by a plurality of liquid inlet pipes, and the liquid heat dissipater is then connected with the collector by a plurality of liquid outlet pipes. The liquid cooling heat transfer medium flows into the liquid heat dissipater through the distributor and the liquid inlet pipes, and then flows out from the liquid heat dissipater through the liquid outlet pipes, and then is collected by the collector. The liquid cooling heat transfer medium flows from the distributor into the liquid heat dissipater through the liquid inlet pipes, and then flows into the collector through the liquid outlet pipes, thereby forming a circulation loop to take away main heat in the server. The liquid cooling heat transfer medium can be tap water, purified water, an organic solution, an inorganic solution, or Freon, preferably purified water.

Further, the liquid heat dissipater can be provided adjacent to the server chips, or in direct connection with the server chips.

The auxiliary heat dissipation device can be a heat pipe air conditioner. The heat pipe air conditioner can be an air-cooling natural-cooling heat pipe air conditioner comprising an evaporator, a condenser, an air-cooling natural-cooling heat exchange device, an electrically adjusting valve, a chiller, a connecting pipe and internal and external circulation heat transfer mediums. The evaporator is connected with the condenser by the connecting pipe to form an internal circulation loop, and the internal circulation heat transfer medium is carried by the connecting pipe in the internal circulation loop. The chiller is connected with the condenser by the connecting pipe to form an external circulation loop, and the external circulation heat transfer medium is carried by the connecting pipe in the external circulation loop. The internal circulation heat transfer medium in its liquid form inside the evaporator absorbs heat and is evaporated into its gas form, which flows under the driving of circulating power in the heat pipe into the condenser along the connecting pipe. The heat is then taken away by the external circulation heat transfer medium of low temperature provided by the pump. The internal circulation heat transfer medium is condensed into its liquid form which flows back to the evaporator along the connecting pipe, thereby forming a circulation. The internal circulation heat transfer medium is Freon, preferably R134a Freon that is environmentally friendly and has a low operating pressure. The external circulation heat transfer medium is water or an antifreeze solution, preferably antifreeze solution such as ethylene glycol solution in areas where the minimal temperature can be lower than 0° C.

Further, the air-cooling natural-cooling heat pipe air conditioner may further comprise a fan and a pump, wherein the fan is provided at outlet side of the evaporator, and the pump is provided between the condenser and the chiller.

Furthermore, the water-circulating natural-cooling heat exchange device may comprise an axial flow fan and a natural-cooling heat exchange coiled pipe. The natural-cooling heat exchange coiled pipe can be connected in series or parallel on the connecting pipe.

Specifically, in one condition, the connecting pipe in the internal circulation loop comprises an air pipe and a liquid pipe. The evaporator and the condenser are respectively connected with the air pipe and the liquid pipe to form the internal circulation loop. The air-cooling natural-cooling heat exchange device and the electrically adjusting valve are provided on the air pipe, wherein the electrically adjusting valve is provided on an inlet or outlet pipe of the air-cooling natural-cooling heat exchange device, preferably installed on the outlet pipe.

In the other condition, the connecting pipe in the internal circulation loop comprises an air pipe and a liquid pipe. The evaporator and the condenser are respectively connected with the air pipe and the liquid pipe to form the internal circulation loop. One end of the air-cooling natural-cooling heat exchange device is arranged on the air pipe, and the other end arranged on the liquid pipe. The electrically adjusting valve is provided on an inlet or outlet pipe of the air-cooling natural-cooling heat exchange device, preferably installed on the outlet pipe.

The first condition is preferred, since it can provide a longer natural-cooling operating time and a more significant energy saving effect.

The liquid cooling device can be externally installed on the cabinet body fixedly or movably, preferably fixedly.

The liquid inlet pipes and the liquid outlet pipes of the liquid cooling device can be hard pipes or soft pipes, preferably soft pipes. The evaporator of the air-cooling natural-cooling heat pipe air conditioner can be installed at a front door side or back door side of the cabinet body, preferably on the back door side. The evaporator can be opened by rotating around a shaft, and the air pipe and the liquid pipe of the evaporator can both be soft pipes.

The electrically adjusting valve of the air-cooling natural-cooling heat pipe air conditioner can be a two-way valve or a three-way valve, preferably a three-way valve.

When the water-circulating natural-cooling heat exchange device is connected in series on the connecting pipe of the internal circulation loop, the cooling system operates in the following way.

11) When environment temperature is above 20° C., the chiller is activated, and the air-cooling natural-cooling heat exchange device is stopped. The bypass of the electrically adjusting valve is 0% opened, and the internal circulation heat transfer medium does not flow through the air-cooling natural-cooling heat exchange device. The axial flow fan is also stopped. All the cooling capacity required by condensation of the internal circulation heat transfer medium is provided by two heat transfer by the condenser and the chiller;

12) When environment temperature is 0-20° C., the chiller and the air-cooling natural-cooling heat exchange device are both activated. The bypass of the electrically adjusting valve is 100% opened, and all the internal circulation heat transfer medium first flows through the air-cooling natural-cooling heat exchange device, where the internal circulation heat transfer medium is pre-cooled by forced-convection heat transfer of the axial flow fan and the natural-cooling heat exchange coiled pipe, and then flows through the condenser, where the remaining condensation heat is taken away by the external circulation heat transfer medium of low temperature provided by the chiller and the pump;

13) When environment temperature is below 0° C., the chiller is stopped, and the air-cooling natural-cooling heat exchange device is activated. The bypass of the electrically adjusting valve is firstly 100% opened, and all the internal circulation heat transfer medium first flows through the air-cooling natural-cooling heat exchange device, and the cooling capacity generated by natural-cooling is adjusted by adjusting the rotation rate of the axial flow fan in the following way: when the outlet temperature of the internal circulation heat transfer medium is below 8° C., the rotation rate of the axial flow fan is reduced, thereby increasing the outlet temperature of the internal circulation heat transfer medium; when the outlet temperature of the internal circulation heat transfer medium is above 12° C., the rotation rate of the axial flow fan is increased, thereby reducing the outlet temperature of the internal circulation heat transfer medium; when the outlet temperature of the internal circulation heat transfer medium is between 8-12° C., the rotation rate of the axial flow fan is kept constant. The outlet temperature of the internal circulation heat transfer medium is adjusted by the axial flow fan to be kept in a suitable range, optimally between 8-12° C.;

14) When environment temperature is extremely low, the axial flow fan is already working at its minimal rotation rate, however the cooling capacity generated by natural-cooling is still too high, i.e., the outlet temperature of the internal circulation heat transfer medium is below 12° C., then the axial flow fan is kept stably working at its minimal rotation rate, and the cooling capacity generated by natural-cooling is adjusted by adjusting the opening of the bypass of the electrically adjusting valve in the following way: when the outlet temperature of the internal circulation heat transfer medium is below 8° C., the opening of the bypass of the electrically adjusting valve is reduced, thereby increasing the outlet temperature of the internal circulation heat transfer medium; when the outlet temperature of the internal circulation heat transfer medium is above 12° C., the opening of the bypass of the electrically adjusting valve is increased, thereby reducing the outlet temperature of the internal circulation heat transfer medium; when the outlet temperature of the internal circulation heat transfer medium is between 8-12° C., the opening of the bypass of the electrically adjusting valve is kept constant. The outlet temperature of the internal circulation heat transfer medium is adjusted by the electrically adjusting valve to be kept in a suitable range, optimally between 8-12° C.

When the water-circulating natural-cooling heat exchange device is connected in parallel on the connecting pipe of the internal circulation loop, the cooling system operates in the following way.

21) When environment temperature is above 0° C., the chiller is activated, and the air-cooling natural-cooling heat exchange device is stopped. The bypass of the electrically adjusting valve is 0% opened, and the internal circulation heat transfer medium does not flow through the air-cooling natural-cooling heat exchange device. The axial flow fan is also stopped. All the cooling capacity required by condensation of the internal circulation heat transfer medium is provided by two heat transfer by the condenser and the chiller;

22) When environment temperature is below 0° C., the chiller is stopped, and the air-cooling natural-cooling heat exchange device is activated. The bypass of the electrically adjusting valve is firstly 100% opened, and all the internal circulation heat transfer medium first flows through the air-cooling natural-cooling heat exchange device, and the cooling capacity generated by natural-cooling is adjusted by adjusting the rotation rate of the axial flow fan in the following way: when the outlet temperature of the internal circulation heat transfer medium is below 8° C., the rotation rate of the axial flow fan is reduced, thereby increasing the outlet temperature of the internal circulation heat transfer medium; when the outlet temperature of the internal circulation heat transfer medium is above 12° C., the rotation rate of the axial flow fan is increased, thereby reducing the outlet temperature of the internal circulation heat transfer medium; when the outlet temperature of the internal circulation heat transfer medium is between 8-12° C., the rotation rate of the axial flow fan is kept constant. The outlet temperature of the internal circulation heat transfer medium is adjusted by the axial flow fan to be kept in a suitable range, optimally between 8-12° C.;

23) When environment temperature is extremely low, the axial flow fan is already working at its minimal rotation rate, however the cooling capacity generated by natural-cooling is still too high, i.e., the outlet temperature of the internal circulation heat transfer medium is below 12° C., then the axial flow fan is kept stably working at its minimal rotation rate, and the cooling capacity generated by natural-cooling is adjusted by adjusting the opening of the bypass of the electrically adjusting valve in the following way: when the outlet temperature of the internal circulation heat transfer medium is below 8° C., the opening of the bypass of the electrically adjusting valve is reduced, thereby increasing the outlet temperature of the internal circulation heat transfer medium; when the outlet temperature of the internal circulation heat transfer medium is above 12° C., the opening of the bypass of the electrically adjusting valve is increased, thereby reducing the outlet temperature of the internal circulation heat transfer medium; when the outlet temperature of the internal circulation heat transfer medium is between 8-12° C., the opening of the bypass of the electrically adjusting valve is kept constant. The outlet temperature of the internal circulation heat transfer medium is adjusted by the electrically adjusting valve to be kept in a suitable range, optimally between 8-12° C.

One solution provides that the liquid cooling device comprises a liquid heat dissipater, a distributor, a collector, and a primary heat transfer medium. The liquid heat dissipater is provided for performing heat dissipation to server chips, the distributor is connected with the liquid heat dissipater by a plurality of liquid inlet pipes, and the liquid heat dissipater is then connected with the collector by a plurality of liquid outlet pipes. The primary heat transfer medium flows into the liquid heat dissipater through the distributor and the liquid inlet pipes, and then flows out from the liquid heat dissipater through the liquid outlet pipes, and then is collected by the collector. The primary heat transfer medium flows from the distributor into the liquid heat dissipater through the liquid inlet pipes, and then flows into the collector through the liquid outlet pipes, thereby forming a circulation loop to take away main heat in the server. The primary heat transfer medium can be tap water, purified water, an organic solution, an inorganic solution, or Freon, preferably purified water.

Further, the liquid cooling device can be externally installed on the cabinet body fixedly or movably, preferably fixedly. The liquid heat dissipater can be provided adjacent to the server chips, or in direct connection with the server chips.

The auxiliary heat dissipation device can be a heat pipe air conditioner. The heat pipe air conditioner can be a door-type heat pipe air conditioner comprising an evaporator, a condenser, a connecting pipe and a secondary heat transfer medium. The evaporator is connected with the condenser by the connecting pipe to form a circulation loop, and the secondary heat transfer medium is carried by the connecting pipe.

Further, the door-type heat pipe air conditioner further comprises a chiller and a pump, both provided outside the computer room and connected with the condenser by the connecting pipe. The secondary heat transfer medium is carried from the chiller into the evaporator by the connecting pipe, absorbs heat and then is evaporated into its gas form, which flows under the driving of the heat pipe into the condenser along the air pipe to turn into its liquid form, which flows back to the evaporator along the liquid pipe, thereby forming a circulation loop. The secondary heat transfer medium is Freon, preferably R134a Freon that is environmentally friendly and has a low operating pressure.

Furthermore, the door-type heat pipe air conditioner further comprises a fan installed at an air outlet side of the evaporator.

The liquid inlet pipes and the liquid outlet pipes of the liquid cooling device can be hard pipes or soft pipes, preferably soft pipes. The connecting pipes of the evaporator can all be soft pipes.

The fan can be a centrifugal fan, an axial flow fan or a mixed flow fan, preferably an axial flow fan. The evaporator can be a heat exchanger with aluminum micro-channels or a heat exchanger with a copper pipe surrounded by aluminum fins, preferably the latter. The evaporator is preferably installed at a back door side, and can be opened by rotating around a shaft. The condenser can be a plate heat exchanger, a shell and tube heat exchanger or a double-pipe heat interchanger, preferably a plate heat exchanger. The chiller can be an air-cooling chiller, a water-cooler chiller or a evaporative condensing chiller, preferably a plate heat exchanger.

During operation of this server liquid cooling system, heat generated by chips in the liquid cooling server that accounts for 80% of the total heat is absorbed by the liquid heat dissipater, and is taken away by the primary heat transfer medium flowing through the liquid heat dissipater and having the temperature of about 35-45° C., keeping the temperature inside the liquid cooling server of 60-70° C. to provide a normal operation status. Flow distribution and collection of the primary heat transfer medium of the liquid heat dissipater inside each liquid cooling server are all accomplished by the liquid cooling device. The primary heat transfer medium having the temperature of about 35-45° C. flows from a liquid supplying main pipe into the distributor, and then flows into the liquid heat dissipater by the liquid inlet pipes to absorb heat of the server chips, after which it becomes 40-50° C. and then flows into the collector by the liquid outlet pipes, and flows back to a liquid collecting main pipe.

Heat generated by other elements in the liquid cooling server that accounts for about 20% of the total heat is taken away by air flow generated by a fan in the server itself or in the door-type heat pipe air conditioner. Heat in the air flow is absorbed by the secondary heat transfer medium flowing through the evaporator of the door-type heat pipe air conditioner and having the temperature of 15-20° C., allowing the air flow be cooled to about 20-25° C. again and then flow again into the server to take away heat generated by inner elements of the server, and so the cycle repeats. The secondary heat transfer medium in its liquid form inside the evaporator absorbs heat and is evaporated into its gas form, which flows into the condenser along the connecting pipe under driving of circulating power in the heat pipe, where its heat is taken away by low temperature cold water provided by the chiller and pump. The medium is condensed into its liquid form, and flows back into the evaporator along the connecting pipe, and so the cycle repeats.

One solution provides that the liquid cooling device comprises a liquid heat dissipater, a distributor, a collector, and a liquid cooling heat transfer medium. The liquid heat dissipater is provided for performing heat dissipation to server chips, the distributor is connected with the liquid heat dissipater by a plurality of liquid inlet pipes, and the liquid heat dissipater is then connected with the collector by a plurality of liquid outlet pipes. The liquid cooling heat transfer medium flows into the liquid heat dissipater through the distributor and the liquid inlet pipes, and then flows out from the liquid heat dissipater through the liquid outlet pipes, and then is collected by the collector. The liquid cooling heat transfer medium flows from the distributor into the liquid heat dissipater through the liquid inlet pipes, and then flows into the collector through the liquid outlet pipes, thereby forming a circulation loop to take away main heat in the server. The liquid cooling heat transfer medium can be tap water, purified water, an organic solution, an inorganic solution, or Freon, preferably purified water.

The liquid heat dissipater can be provided adjacent to the server chips, or in direct connection with the server chips.

The auxiliary heat dissipation device can be a heat pipe air conditioner. The heat pipe air conditioner can be a water-circulating natural-cooling heat pipe air conditioner comprising an evaporator, a water-circulating natural-cooling heat exchange device, an electrically adjusting valve, a condenser, a chiller, a connecting pipe and internal and external circulation heat transfer mediums. The evaporator is connected with the condenser by the connecting pipe to form an internal circulation loop, and the internal circulation heat transfer medium is carried by the connecting pipe in the internal circulation loop. The chiller is connected with the condenser by the connecting pipe to form an external circulation loop, and the external circulation heat transfer medium is carried by the connecting pipe in the external circulation loop.

Further, the water-circulating natural-cooling heat pipe air conditioner may further comprise a fan and a pump, wherein the fan is provided at outlet side of the evaporator, and the pump is provided between the condenser and the chiller.

Furthermore, the water-circulating natural-cooling heat exchange device may comprise an axial flow fan and a natural-cooling heat exchange coiled pipe. The natural-cooling heat exchange coiled pipe can be connected in series or parallel on the connecting pipe. The electrically adjusting valve is provided on an inlet or outlet pipe of the water-circulating cooling heat exchange device.

Specifically, in one condition, the connecting pipe in the internal circulation loop comprises an air pipe and a liquid pipe. The evaporator and the condenser are respectively connected with the air pipe and the liquid pipe to form the internal circulation loop. The connecting pipe in the external circulation loop comprises a liquid inlet pipe and a liquid outlet pipe. The condenser and the chiller are respectively connected with the liquid inlet pipe and the liquid outlet pipe to form the external circulation loop. The water-circulating natural-cooling heat exchange device is connected in series on the liquid inlet pipe. The electrically adjusting valve is provided on an inlet or outlet pipe of the water-circulating natural-cooling heat exchange device, preferably installed on the outlet pipe.

In the other condition, the connecting pipe in the internal circulation loop comprises an air pipe and a liquid pipe. The evaporator and the condenser are respectively connected with the air pipe and the liquid pipe to form the internal circulation loop. The connecting pipe in the external circulation loop comprises a liquid inlet pipe and a liquid outlet pipe. The condenser and the chiller are respectively connected with the liquid inlet pipe and the liquid outlet pipe to form the external circulation loop. One end of the water-circulating natural-cooling heat exchange device is arranged on the liquid inlet pipe, and the other end arranged on the liquid outlet pipe. The electrically adjusting valve is provided on an inlet or outlet pipe of the water-circulating natural-cooling heat exchange device, preferably installed on the outlet pipe.

The first condition is preferred, since it can provide a longer natural-cooling operating time and a more significant energy saving effect.

The internal circulation heat transfer medium in its liquid form inside the evaporator absorbs heat and is evaporated into its gas form, which flows into the condenser along the connecting pipe under driving of circulating power in the heat pipe, where its heat is taken away by the external circulation heat transfer medium of low temperature provided by the pump. The internal circulation heat transfer medium is condensed into its liquid form, which flows back into the evaporator along the connecting pipe, thereby forming a circulation. The internal circulation heat transfer medium is Freon, preferably R134a Freon that is environmentally friendly and has a low operating pressure. The external circulation heat transfer medium is water or an antifreeze solution, preferably antifreeze solution such as ethylene glycol solution in areas where the minimal temperature can be lower than 0° C.

The liquid cooling device can be externally installed on the cabinet body fixedly or movably, preferably fixedly.

The liquid inlet pipes and the liquid outlet pipes of the liquid cooling device can be hard pipes or soft pipes, preferably soft pipes. The evaporator of the water-circulating natural-cooling heat pipe air conditioner can be installed at a front door side or back door side of the cabinet body, preferably on the back door side. The evaporator can be opened by rotating around a shaft, and the air pipe and the liquid pipe of the evaporator can both be soft pipes.

The electrically adjusting valve of the water-circulating natural-cooling heat pipe air conditioner can be a two-way valve or a three-way valve, preferably a three-way valve.

When the water-circulating natural-cooling heat exchange device is connected in series on the connecting pipe of the external circulation loop, the cooling system operates in the following way.

31) When environment temperature is above 20° C., the chiller is activated, and the water-circulating natural-cooling heat exchange device is stopped. The bypass of the electrically adjusting valve is 0% opened, and the external circulation heat transfer medium does not flow through the water-circulating natural-cooling heat exchange device. The axial flow fan is also stopped. All the cooling capacity of the external circulation heat transfer medium is provided by the chiller;

32) When environment temperature is 0-20° C., the chiller and the water-circulating natural-cooling heat exchange device are both activated. The bypass of the electrically adjusting valve is 100% opened, and all the external circulation heat transfer medium first flows through the water-circulating natural-cooling heat exchange device, where the external circulation heat transfer medium is pre-cooled by forced-convection heat transfer of the axial flow fan and the natural-cooling heat exchange coiled pipe, and then flows through the condenser to perform compensated cooling to reach the required temperature;

33) When environment temperature is below 0° C., the chiller is stopped, and the water-circulating natural-cooling heat exchange device is activated. The bypass of the electrically adjusting valve is firstly 100% opened, and all the external circulation heat transfer medium first flows through the water-circulating natural-cooling heat exchange device, and the cooling capacity generated by natural-cooling is adjusted by adjusting the rotation rate of the axial flow fan in the following way: when the outlet temperature of the external circulation heat transfer medium is below 8° C., the rotation rate of the axial flow fan is reduced, thereby increasing the outlet temperature of the external circulation heat transfer medium; when the outlet temperature of the external circulation heat transfer medium is above 12° C., the rotation rate of the axial flow fan is increased, thereby reducing the outlet temperature of the external circulation heat transfer medium; when the outlet temperature of the external circulation heat transfer medium is between 8-12° C., the rotation rate of the axial flow fan is kept constant. The outlet temperature of the external circulation heat transfer medium is adjusted by the axial flow fan to be kept in a suitable range, optimally between 8-12° C.;

34) When environment temperature is extremely low, the axial flow fan is already working at its minimal rotation rate, however the cooling capacity generated by natural-cooling is still too high, i.e., the outlet temperature of the external circulation heat transfer medium is below 12° C., then the axial flow fan is kept stably working at its minimal rotation rate, and the cooling capacity generated by natural-cooling is adjusted by adjusting the opening of the bypass of the electrically adjusting valve in the following way: when the outlet temperature of the external circulation heat transfer medium is below 8° C., the opening of the bypass of the electrically adjusting valve is reduced, thereby increasing the outlet temperature of the external circulation heat transfer medium; when the outlet temperature of the external circulation heat transfer medium is above 12° C., the opening of the bypass of the electrically adjusting valve is increased, thereby reducing the outlet temperature of the external circulation heat transfer medium; when the outlet temperature of the external circulation heat transfer medium is between 8-12° C., the opening of the bypass of the electrically adjusting valve is kept constant. The outlet temperature of the external circulation heat transfer medium is adjusted by the electrically adjusting valve to be kept in a suitable range, optimally between 8-12° C.

When the water-circulating natural-cooling heat exchange device is connected in parallel on the connecting pipe of the external circulation loop, the cooling system operates in the following way.

41) When environment temperature is above 0° C., the chiller is activated, and the water-circulating natural-cooling heat exchange device is stopped. The bypass of the electrically adjusting valve is 0% opened, and the external circulation heat transfer medium does not flow through the water-circulating natural-cooling heat exchange device. The axial flow fan is also stopped. All the cooling capacity of the external circulation heat transfer medium is provided by the chiller;

42) When environment temperature is below 0° C., the chiller is stopped, and the water-circulating natural-cooling heat exchange device is activated. The bypass of the electrically adjusting valve is firstly 100% opened, and all the external circulation heat transfer medium first flows through the water-circulating natural-cooling heat exchange device, and the cooling capacity generated by natural-cooling is adjusted by adjusting the rotation rate of the axial flow fan in the following way: when the outlet temperature of the external circulation heat transfer medium is below 8° C., the rotation rate of the axial flow fan is reduced, thereby increasing the outlet temperature of the external circulation heat transfer medium; when the outlet temperature of the external circulation heat transfer medium is above 12° C., the rotation rate of the axial flow fan is increased, thereby reducing the outlet temperature of the external circulation heat transfer medium; when the outlet temperature of the external circulation heat transfer medium is between 8-12° C., the rotation rate of the axial flow fan is kept constant. The outlet temperature of the external circulation heat transfer medium is adjusted by the axial flow fan to be kept in a suitable range, optimally between 8-12° C.;

43) When environment temperature is extremely low, the axial flow fan is already working at its minimal rotation rate, however the cooling capacity generated by natural-cooling is still too high, i.e., the outlet temperature of the external circulation heat transfer medium is below 12° C., then the axial flow fan is kept stably working at its minimal rotation rate, and the cooling capacity generated by natural-cooling is adjusted by adjusting the opening of the bypass of the electrically adjusting valve in the following way: when the outlet temperature of the external circulation heat transfer medium is below 8° C., the opening of the bypass of the electrically adjusting valve is reduced, thereby increasing the outlet temperature of the external circulation heat transfer medium; when the outlet temperature of the external circulation heat transfer medium is above 12° C., the opening of the bypass of the electrically adjusting valve is increased, thereby reducing the outlet temperature of the external circulation heat transfer medium; when the outlet temperature of the external circulation heat transfer medium is between 8-12° C., the opening of the bypass of the electrically adjusting valve is kept constant. The outlet temperature of the external circulation heat transfer medium is adjusted by the electrically adjusting valve to be kept in a suitable range, optimally between 8-12° C.

One solution provides that the liquid cooling device comprises an internal circulation system and an external circulation system. The internal circulation system comprises a liquid heat transfer pipe provided inside the server, an intermediate heat exchanger, an internal circulation inlet pipe, and an internal circulation outlet pipe. The intermediate heat exchanger is connected with the liquid heat transfer pipe by the internal circulation inlet pipe and the internal circulation outlet pipe to form a circulation loop. A pressure stabilizing liquid supplying device and a first circulating liquid pump are further provided on the internal circulation inlet pipe. The external circulation system is a circulation loop formed by successively connecting a cold liquid tower, a liquid tank, a second circulating liquid pump, and the intermediate heat exchanger. Heat transfer between the internal circulation system and the external circulation system is provided by the intermediate heat exchanger. Furthermore, the internal circulation system and the external circulation system both use water as a refrigerant.

The liquid heat transfer pipe is a heat pipe component, with one end directly contacting the server chips to transfer heat, and the other end integrated in the internal circulation system to exchange heat. Multiple liquid heat transfer pipes are connected in parallel in the internal circulation system. The liquid heat transfer pipe of the server is filled with refrigerant which is a gas at normal temperature and pressure, with one end directly contacting the server chips to transfer heat, and the other end exchanging heat with a liquid coolant in the internal circulation system. Since various electronic components are installed inside the server, in order to prevent circulation system liquid from leaking to the electronic components, a liquid blocking plate is provided in the server cabinet, for protection and isolation to two ends of the liquid heat transfer pipe in each server. During operation, natural-convection heat transfer is performed by circulating of the coolant in the internal circulation system, continuously spreading the heat generated by the server chips into the environment. Between the server chips and the outer liquid cooling device, a heat pipe heat exchange component is used to perform intermediate cooling, which can prevent liquid from directly going inside the server, thereby reducing possibility of server damaging due to liquid system leakage.

During operation, the heat transferred from the server chips to the liquid heat transfer pipe is taken away by the internal circulation system, and the heat absorbed by the external circulation system is taken away by the external circulation system.

Furthermore, the auxiliary heat dissipation device is one or more air-cooling inter-row air conditioners and is installed in parallel to the server cabinet. Multiple servers are installed side by side in the server cabinet. Adjacent server cabinets are installed facing each other to form alternating cold passage and hot passage, and air is supplied to the cold passage and then returned from the hot passage by the air-cooling inter-row air conditioners. Air is cooled by the inter-row air conditioner, and remaining heat of the server is taken away by the air of low temperature. Humidity of the computer room can be adjusted by heating and humidifying function of the air-cooling inter-row air conditioners.

The first or second circulating liquid pump is a variable frequency pump or a fixed frequency pump. Fluid flow in the power driving pipe is provided by the first or second circulating liquid pump. The intermediate heat exchanger is a plate heat exchanger.

The present invention provides the following advantages over the prior art:

(1) It allows separated designing of the server cabinet and the liquid cooling water distributing device, such that the cabinet does not need to be customized. A liquid cooling device having a water distributing system independently installed on a standard server cabinet can provide the server with functions of distributing and collecting liquid cooling heat exchange medium, which is advantageous for practicalization and popularization of liquid cooling technique.

(2) Main cooling is performed by liquid cooling technique, which only requires heat exchange medium of 35-45° C. (such as purified water) and requires no mechanical cooling device or systems such as compressor cooling, thus providing super high density cooling and super high energy saving.

(3) Auxiliary cooling is performed in a completely dry condition and produces no condensed water, which avoids loss caused by humidification and dehumidification. It also provides a short air supplying distance which allows efficient operation of the fan. It can even operate without fan, such as cooling by the fan in the server itself. Therefore it can efficiently solve problem of local heating in the cabinet.

(4) Natural-cooling technique is used in the present invention, which sufficiently uses natural cold sources in transition seasons and in winter to provide the auxiliary heat dissipation system with cooling capacity, thereby providing significant energy saving effect.

(5) The whole system of the present invention is simple and requires small investment. It occupies almost no space in the cabinet, increasing space utilization rate in the computer room.

(6) The system requires no power device inside the computer room, operates with no noise, and is safe and environmentally friendly, thus providing an efficient and energy saving, safe and stable data room.

BRIEF DESCRIPTION TO THE DRAWINGS

FIG. 1 is a schematic view showing the structure and principle of Example 1, wherein:
- 1. cabinet body; 2. liquid cooling server; 3. chip of the liquid cooling server; 4. liquid heat dissipater; 5. collector; 6. distributor; 7. liquid inlet pipe; 8. cold water heat exchanger; 9. fan; 13. pump; 14. chiller; 15. primary heat transfer medium; 16. secondary heat transfer medium; 17. liquid outlet pipe; I. liquid cooling server cabinet; II. liquid cooling device; III. door-type cold water heat exchange device.

FIG. 2 is a schematic view showing the structure and principle of Example 2, wherein:
- 1. cabinet body; 2. liquid cooling server; 3. chip of the liquid cooling server; 4. liquid heat dissipater; 5. collector; 6. distributor; 7. liquid inlet pipe; 8. cold water heat exchanger; 9. fan; 11. water outlet pipe; 12. water inlet pipe; 13. pump; 14. chiller; 15. primary heat transfer medium; 16. secondary heat transfer medium; 17. liquid outlet pipe; 18. water-circulating natural-cooling heat exchange device; 19. axial flow fan; 20. natural-cooling heat exchange coiled pipe; 21. electrically adjusting valve; I. liquid cooling server cabinet; II. liquid cooling device; VII. natural-cooling cold water device.

FIG. 3 is a schematic view showing the structure and principle of Example 3, wherein:

1. cabinet body; 2. liquid cooling server; 3. chip of the liquid cooling server; 4. liquid heat dissipater; 5. collector; 6. distributor; 7. liquid inlet pipe; 8. cold water heat exchanger; 9. fan; 11. water outlet pipe; 12. water inlet pipe; 13. pump; 14. chiller; 15. liquid cooling heat transfer medium; 16. secondary heat transfer medium; 17. liquid outlet pipe; 18. water-circulating natural-cooling heat exchange device; 19. axial flow fan; 20. natural-cooling heat exchange coiled pipe; 21. electrically adjusting valve; I. liquid cooling server cabinet; II. liquid cooling device; VII. natural-cooling cold water device.

FIG. 4 is a schematic view showing the structure and principle of Example 4, wherein:

1. cabinet body; 2. liquid cooling server; 3. chip of the liquid cooling server; 4. liquid heat dissipater; 5. collector; 6. distributor; 7. liquid inlet pipe; 8. cold water heat exchanger; 9. fan; 10. condenser; 13. pump; 14. chiller; 15. primary heat transfer medium; 16. secondary heat transfer medium; 17. liquid outlet pipe; 25. evaporator; 26. liquid pipe; 27. air pipe; I. liquid cooling server cabinet; H. liquid cooling device; IV. door-type heat pipe air conditioner.

FIG. 5 is a schematic view showing the structure and principle of Example 5, wherein:

1. cabinet body; 2. liquid cooling server; 3. chip of the liquid cooling server; 4. liquid heat dissipater; 5. collector; 6. distributor; 7. liquid inlet pipe; 9. fan; 10. condenser; 13. pump; 14. chiller; 17. liquid outlet pipe; 18. air-cooling natural-cooling heat exchange device; 19. axial flow fan; 20. natural-cooling heat exchange coiled pipe; 21. electrically adjusting valve; 22. external circulation heat transfer medium; 23. liquid cooling heat transfer medium; 24. internal circulation heat transfer medium; 25. evaporator; 26. liquid pipe; 27. air pipe; I. liquid cooling server cabinet; II. liquid cooling device; V. air-cooling natural-cooling heat pipe air conditioner.

FIG. 6 is a schematic view showing the structure and principle of Example 6, wherein:

1. cabinet body; 2. liquid cooling server; 3. chip of the liquid cooling server; 4. liquid heat dissipater; 5. collector; 6. distributor; 7. liquid inlet pipe; 9. fan; 10. condenser; 13. pump; 14. chiller; 15. liquid cooling heat transfer medium; 17. liquid outlet pipe; 18. air-cooling natural-cooling heat exchange device; 19. axial flow fan; 20. natural-cooling heat exchange coiled pipe; 21. electrically adjusting valve; 22. external circulation heat transfer medium; 23. liquid cooling heat transfer medium; 24. internal circulation heat transfer medium; 25. evaporator; 26. liquid pipe; 27. air pipe; I. liquid cooling server cabinet; II. liquid cooling device; V. air-cooling natural-cooling heat pipe air conditioner.

FIG. 7 is a schematic view showing the structure and principle of Example 7, wherein:

1. cabinet body; 2. liquid cooling server; 3. chip of the liquid cooling server; 4. liquid heat dissipater; 5. collector; 6. distributor; 7. liquid inlet pipe; 9. fan; 10. condenser; 13. pump; 14. chiller; 17. liquid outlet pipe; 19. axial flow fan; 20. natural-cooling heat exchange coiled pipe; 21. electrically adjusting valve; 22. external circulation heat transfer medium; 23. liquid cooling heat transfer medium; 24. internal circulation heat transfer medium; 25. evaporator; 26. liquid pipe; 27. air pipe; 28. liquid inlet pipe; 29. liquid outlet pipe; 30. water-circulating natural-cooling heat exchange device; I. liquid cooling server cabinet; II. liquid cooling device; VI. water-circulating natural-cooling heat pipe air conditioner.

FIG. 8 is a schematic view showing the structure and principle of Example 8, wherein:

1. cabinet body; 2. liquid cooling server; 3. chip of the liquid cooling server; 4. liquid heat dissipater; 5. collector; 6. distributor; 7. liquid inlet pipe; 9. fan; 10. condenser; 13. pump; 14. chiller; 17. liquid outlet pipe; 19. axial flow fan; 20. natural-cooling heat exchange coiled pipe; 21. electrically adjusting valve; 22. external circulation heat transfer medium; 23. liquid cooling heat transfer medium; 24. internal circulation heat transfer medium; 25. evaporator; 26. liquid pipe; 27. air pipe; 28. liquid inlet pipe; 29. liquid outlet pipe; 30. water-circulating natural-cooling heat exchange device; I. liquid cooling server cabinet; II. liquid cooling device; VI. water-circulating natural-cooling heat pipe air conditioner.

FIG. 11 is a top view of Example 10, wherein:

000. liquid cooling device; 001. internal circulation outlet pipe; 002. first circulating liquid pump; 003. pressure stabilizing liquid supplying device; 004. plate heat exchanger; 005. second circulating liquid pump; 006. liquid tank; 007. cold liquid tower; 008. air-cooling inter-row air conditioner; 009. internal circulation inlet pipe; 100. server cabinet; 110. blocking plate of the cabinet; 101. liquid heat transfer pipe; 111. server.

Figure 1:
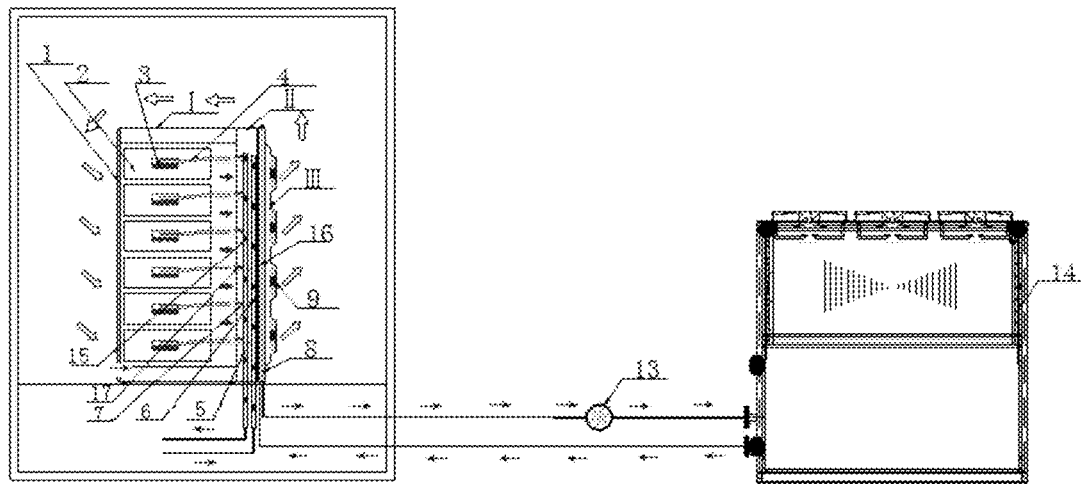
Figure 2:
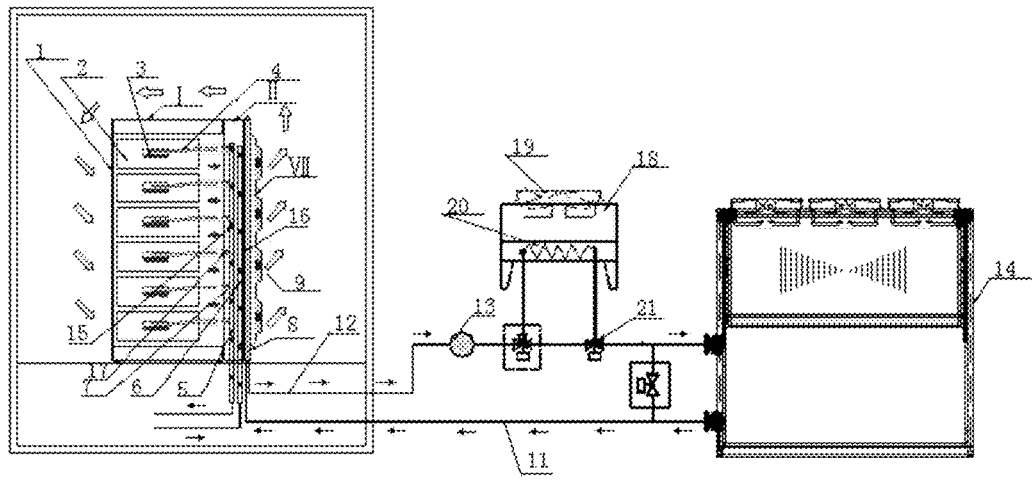
Figure 3:
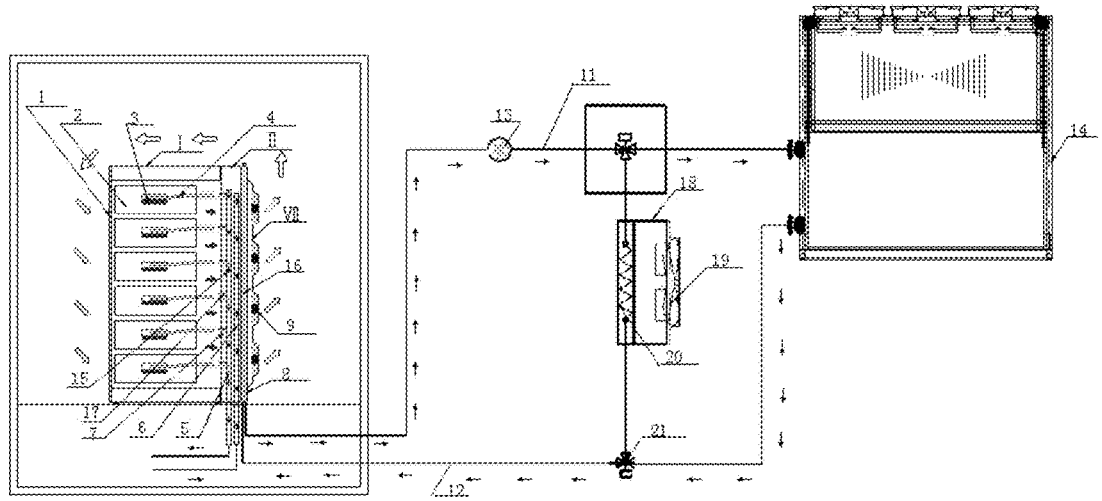
Figure 12:
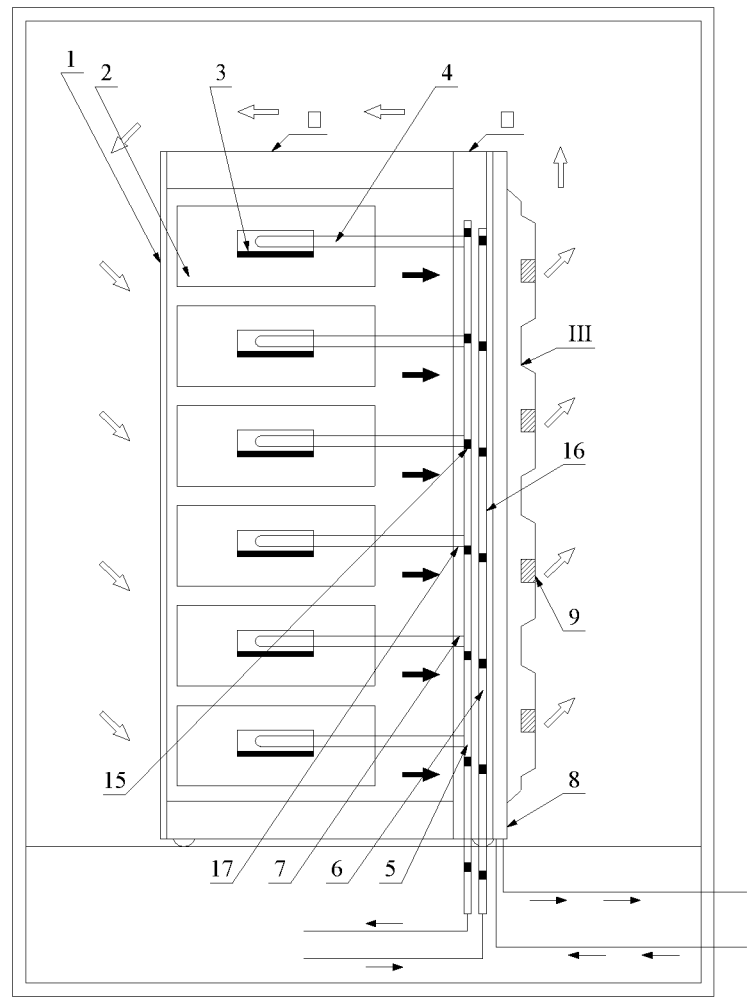

FIG. 12 is a detailed view of the cabinet body in FIGS. 1-3.

Figure 4:
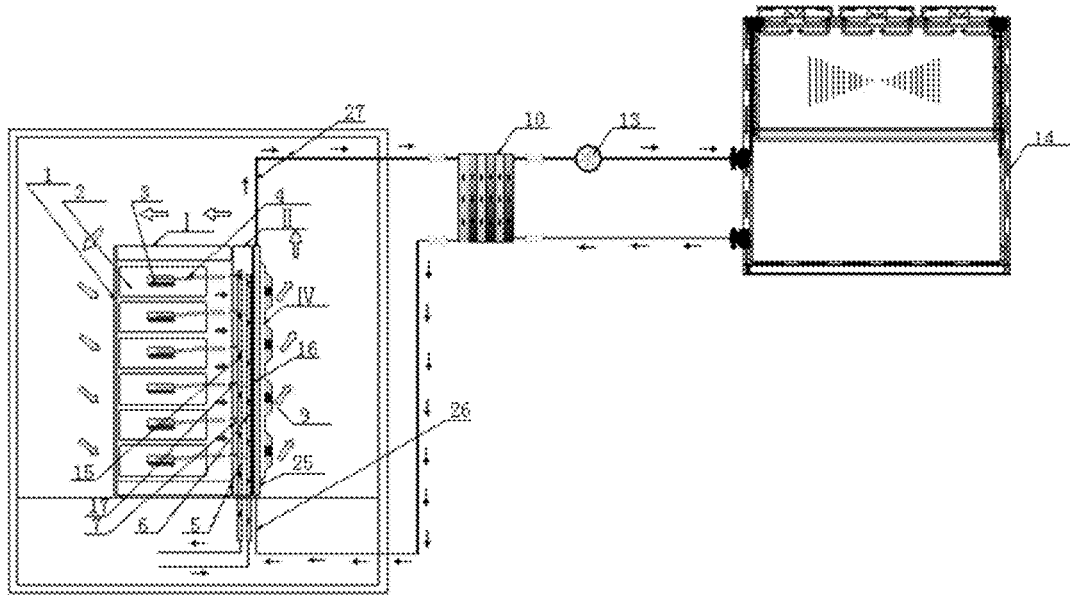
Figure 13:
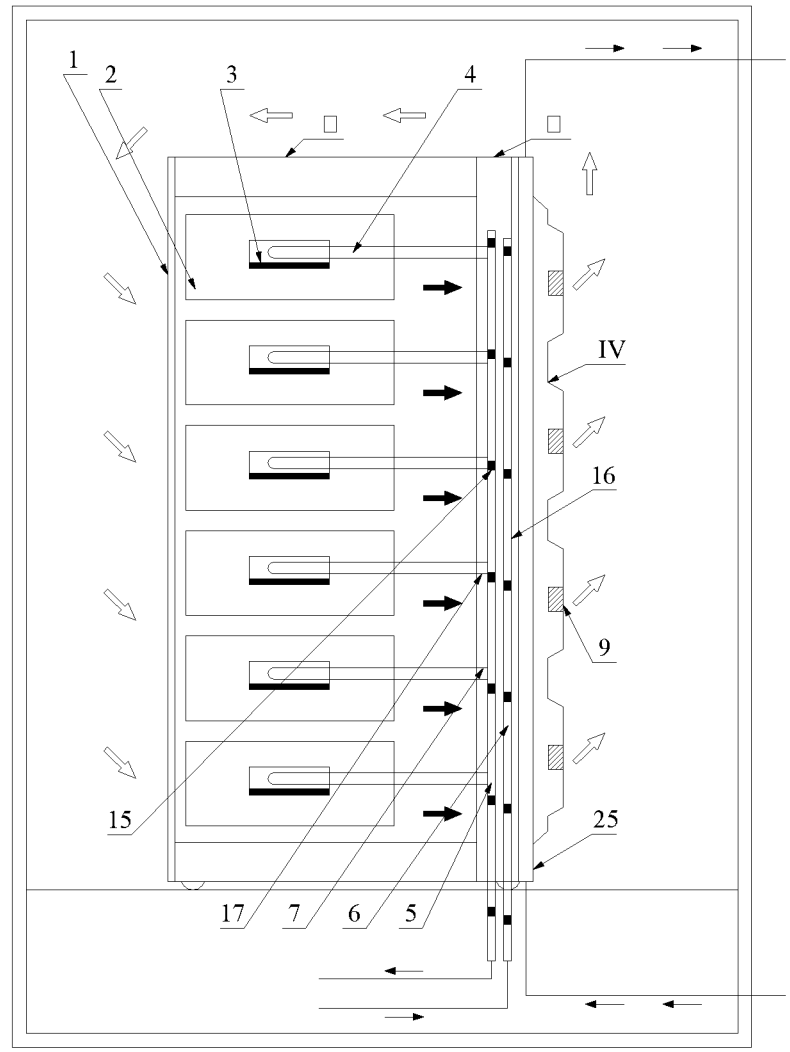

FIG. 13 is a detailed view of the cabinet body in FIG. 4.

Figure 14:
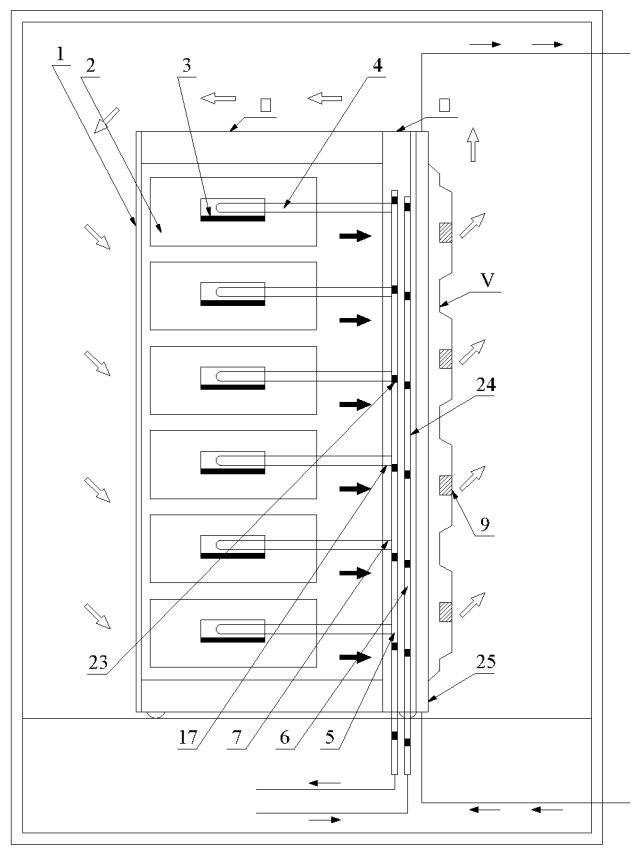

FIG. 14 is a detailed view of the cabinet body in FIGS. 5-8.

DETAILED DESCRIPTION OF THE INVENTION

The present invention will be further described in details in conjugation with embodiments and figures. However, the embodiments are not provided to be limitation in any ways to the present invention.

Example 1

As shown in FIG. 1, a server cabinet heat dissipation system is provided, comprising a liquid cooling server cabinet I, a liquid cooling device II, and a door-type cold water heat exchange device III. The liquid cooling server cabinet I comprises a cabinet body 1 and a liquid cooling server 2. A server chip 3 and a liquid heat dissipater 4 are provided inside the liquid cooling server 2. The liquid cooling device II comprises a distributor 6, a collector 5 and a connecting branch pipe 7. The door-type cold water heat exchange device III comprises a cold water heat exchanger 8, a fan 9, a pump 13 and a chiller 14. The distributor 6 and the collector 5 of the liquid cooling device II are respectively connected with the liquid cooling server 2 by the liquid inlet pipe 7 and an liquid outlet pipe 17. The cold water heat exchanger 8 of the door-type cold water heat exchange device III is installed on the liquid cooling device II.

The liquid cooling device II is externally installed on the cabinet body 1 fixedly or movably, preferably movably.

The liquid inlet pipe 7 of the liquid cooling device II can be a hard pipe or a soft pipe, preferably a soft pipe. Two ends of the liquid inlet pipe 7 and of the liquid outlet pipe 17 are respectively sealingly connected with the liquid cooling server, the distributor 6 and the collector 5.

The cold water heat exchanger 8 of the door-type cold water heat exchange device II can be installed at a front door side or back door side of the cabinet body 1, preferably on the back door side. The cold water heat exchanger 8 of the door-type cold water heat exchange device III can be opened by rotating around a shaft, and water inlet pipe and water outlet pipe of the cold water heat exchanger 8 can both be soft pipes.

The fan 9 of the door-type cold water heat exchange device III is installed at an air outlet side of the cold water heat exchanger 8. The fan 9 can be a centrifugal fan, an axial flow fan, or a mixed flow fan, preferably an axial flow fan. The chiller 14 can be an air-cooling chiller, a water-cooler chiller or an evaporative condensing chiller, preferably an air-cooling chiller.

The primary heat transfer medium 15 of the liquid cooling device II and the liquid cooling server 2 can be tap water, purified water, an organic solution, an inorganic solution, or Freon, preferably purified water.

The secondary heat transfer medium 16 of the door-type cold water heat exchange device III is cold water at a temperature of above 12° C.

The cold water heat exchanger 8 of the door-type cold water heat exchange device III can be a heat exchanger with aluminum micro-channels or a heat exchanger with a copper pipe surrounded by aluminum fins, preferably a copper pipe surrounded by aluminum fins.

During operation of this system, heat generated by the chip 3 in the liquid cooling server 2 that accounts for 80% of the total heat is absorbed by the liquid heat dissipater 4, and is taken away by the primary heat transfer medium 15 flowing through the liquid heat dissipater 4 and having the temperature of about 35-45° C., keeping the temperature inside the server chip 3 of 60-70° C. to provide a normal operation status. Flow distribution and collection of the primary heat transfer medium 15 of the liquid heat dissipater 4 inside each liquid cooling server 2 are all accomplished by the liquid cooling device II. The primary heat transfer medium 15 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan 9 in the server itself or in the door-type cold water heat exchange device III. Heat in the air flow is absorbed by the secondary heat transfer medium 16 flowing through the cold water heat exchanger 8 of the door-type cold water heat exchange device III and having the temperature of 15-20° C., allowing the air flow be cooled to about 20-25° C. again and then flow again into the server to take away heat generated by inner elements of the server, and so the cycle repeats. The secondary heat transfer medium 16 inside the cold water heat exchanger 8 having a temperature of 12-15° C. absorbs heat and becomes 17-20° C., and then flows into the chiller 14 under driving of circulating power of the pump 13 to be cooled to 12-15° C. again and then flows again into the cold water heat exchanger 8, and so the cycle repeats.

Example 2

As shown in FIG. 2, a server heat dissipation system is provided, comprising a liquid cooling server cabinet I, a liquid cooling device II, and a natural-cooling cold water device VII. The liquid cooling server cabinet I comprises a cabinet body 1 and multiple liquid cooling servers 2 provided inside the cabinet body. The liquid cooling server 2 is provided with a server chip 3. The liquid cooling device II comprises a liquid heat dissipater 4, a distributor 6, and a collector 5. The distributor 6 and the collector 5 are respectively connected with the liquid heat dissipater 4 inside the liquid cooling server by a plurality of liquid inlet pipes 7 and a plurality of liquid outlet pipes 17. The liquid heat dissipater 4 contacts the server chips 3 or is provided adjacent to the server chips 3. The natural-cooling cold water device VII comprises a cold water heat exchanger 8 provided on the liquid cooling device, a fan 9 installed at an air outlet side of the cold water heat exchanger 8, a water inlet pipe, a water outlet pipe, a pump 13, an electrically adjusting valve 21, a water-circulating natural-cooling heat exchange device 18 and a chiller 14. The chiller 14 and the cold water heat exchanger 8 are respectively connected with the water inlet pipe 11 and the water outlet pipe 12 to form circulation loops. The pump 13, the electrically adjusting valve 21 and the water-circulating natural-cooling heat exchange device 18 are successively connected in series on the water outlet pipe 12. The water-circulating natural-cooling heat exchange device 18 comprises an axial flow fan 19 and a natural-cooling heat exchange coiled pipe 20. The natural-cooling heat exchange coiled pipe 20 is connected in series on the water inlet pipe 11. The cold water heat exchanger 8 is a door-type cold water heat exchanger.

The liquid cooling device II is externally installed on the cabinet body 1 fixedly or movably, preferably movably. The door-type cold water heat exchanger 8 of the natural-cooling cold water device VII is installed on the liquid cooling device II.

The liquid inlet pipe 7 of the liquid cooling device II can be a hard pipe or a soft pipe, preferably a soft pipe.

The door-type cold water heat exchanger 8 of the natural-cooling cold water device VII can be installed at a front door side or back door side of the cabinet body 1, preferably on the back door side. The door-type cold water heat exchanger 8 of the natural-cooling cold water device VII can be opened by rotating around a shaft, and water inlet pipe 11 and water outlet pipe 12 of the door-type cold water heat exchanger 8 can both be soft pipes.

The electrically adjusting valve 21 of the natural-cooling cold water device VII can be a two-way valve or a three-way valve, preferably a three-way valve. The electrically adjusting valve 21 can be installed on inlet or outlet pipes of the water-circulating natural-cooling heat exchange device 18, preferably on the outlet pipe.

The primary heat transfer medium 15 of the liquid cooling device II and the liquid cooling server 2 can be tap water, purified water, an organic solution, an inorganic solution, or Freon, preferably purified water.

The secondary heat transfer medium 16 of the natural-cooling cold water device VII is water or an antifreeze solution.

During operation of this system, heat generated by the chip 3 in the liquid cooling server 2 that accounts for 80% of the total heat is absorbed by the liquid heat dissipater 4, and is taken away by the primary heat transfer medium 15 flowing through the liquid heat dissipater 4 and having the temperature of about 35-45° C., keeping the temperature inside the server chip 3 of 60-70° C. to provide a normal operation status. Flow distribution and collection of the primary heat transfer medium 15 of the liquid heat dissipater 4 inside each liquid cooling server 2 are all accomplished by the liquid cooling device II. The primary heat transfer medium 15 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan 9 in the server itself or in the natural-cooling cold water device VII. Heat in the air flow is absorbed by the secondary heat transfer medium 16 flowing through the door-type cold water heat exchanger 8 of the natural-cooling cold water device VII and having the temperature of 15-20° C., allowing the air flow be cooled to about 20-25° C. again and then flow again into the server to take away heat generated by inner elements of the server, and so the cycle repeats.

In the circulation of the natural-cooling cold water device VII, the secondary heat transfer medium 16 inside the door-type cold water heat exchanger 8 having a temperature of 12-15° C. absorbs heat and becomes 17-20° C., and then flows into the chiller 14 and the water-circulating natural-cooling heat exchange device 18 under driving of circulating power of the pump 13 to be cooled to 12-17° C. again and then flows again into the door-type cold water heat exchanger 8, and so the cycle repeats.

In the external circulation of the natural-cooling cold water device VII, depending on different environment temperatures, there are three operation modes.

1) Complete mechanical cooling operation mode: when environment temperature is high (for example, above 20° C.), the chiller 14 is activated, and the water-circulating natural-cooling heat exchange device 18 is stopped. The bypass of the electrically adjusting valve 21 is 0% opened, and the secondary heat transfer medium 16 does not flow through the water-circulating natural-cooling heat exchange device 18. The axial flow fan 19 is also stopped. All the cooling capacity of the secondary heat transfer medium 16 is provided by the chiller 14;

02) Mixed cooling operation mode: when environment temperature is low (for example 0-20° C.), the chiller 14 and the water-circulating natural-cooling heat exchange device 18 are both activated. The bypass of the electrically adjusting valve 21 is 100% opened, and all the secondary heat transfer medium 16 first flows through the water-circulating natural-cooling heat exchange device 18, where the secondary heat transfer medium 16 is pre-cooled by forced-convection heat transfer of the axial flow fan 19 and the natural-cooling heat exchange coiled pipe 20, and then flows through the chiller 14 to perform compensated cooling to reach the required temperature;

03) Complete natural-cooling operation mode: when environment temperature is low (for example below 0° C.), the chiller 14 is stopped, and the water-circulating natural-cooling heat exchange device 18 is activated. The bypass of the electrically adjusting valve 21 is firstly 100% opened, and all the secondary heat transfer medium 16 first flows through the water-circulating natural-cooling heat exchange device 18, and the cooling capacity generated by natural-cooling is adjusted by adjusting the rotation rate of the axial flow fan 19; when environment temperature is extremely low, the axial flow fan is already working at its minimal rotation rate (generally 10-30%), however the cooling capacity generated by natural-cooling is still too high (the secondary heat transfer medium 16 is of a too below temperature), then the axial flow fan 19 is kept stably working at its minimal rotation rate, and the cooling capacity generated by natural-cooling is adjusted by adjusting the opening of the bypass of the electrically adjusting valve 21.

Example 3

As shown in FIG. 3, a server heat dissipation system is provided, comprising a liquid cooling server cabinet I, a liquid cooling device II, and a natural-cooling cold water device VII. The liquid cooling server cabinet I comprises a cabinet body 1 and multiple liquid cooling servers 2 provided inside the cabinet body. The liquid cooling server 2 is provided with a server chip 3. The liquid cooling device II comprises a liquid heat dissipater 4, a distributor 6, and a collector 5. The distributor 6 and the collector 5 are respectively connected with the liquid heat dissipater 4 inside the liquid cooling server by a plurality of liquid inlet pipes 7 and a plurality of liquid outlet pipes 17. The liquid heat dissipater 4 contacts the server chips 3 or is provided adjacent to the server chips 3. The natural-cooling cold water device VII comprises a cold water heat exchanger 8 provided on the liquid cooling device, a fan 9 installed at an air outlet side of the cold water heat exchanger 8, a water inlet pipe 12, a water outlet pipe 11, a pump 13, an electrically adjusting valve 21, a water-circulating natural-cooling heat exchange device 18 and a chiller 14. The chiller 14 and the cold water heat exchanger 8 are respectively connected with the water inlet pipe 12 and the water outlet pipe 11 to form circulation loops. The water-circulating natural-cooling heat exchange device 18 comprises an axial flow fan 19 and a natural-cooling heat exchange coiled pipe 20. The natural-cooling heat exchange coiled pipe 20 is connected parallel on two ends of the chiller 14, with one end connected with the electrically adjusting valve 21 and the other end connected with the water outlet pipe 11. The cold water heat exchanger 8 is a door-type cold water heat exchanger.

The liquid cooling device II is externally installed on the cabinet body 1 fixedly or movably, preferably fixedly. The door-type cold water heat exchanger 8 of the natural-cooling cold water device VII is installed on the liquid cooling device II.

The liquid inlet pipe 7 of the liquid cooling device II can be a hard pipe or a soft pipe, preferably a soft pipe.

The door-type cold water heat exchanger 8 of the natural-cooling cold water device VII can be installed at a front door side or back door side of the cabinet body 1, preferably on the back door side. The door-type cold water heat exchanger 8 of the natural-cooling cold water device VII can be opened by rotating around a shaft, and water inlet pipe 12 and water outlet pipe 11 of the door-type cold water heat exchanger 8 can both be soft pipes.

The electrically adjusting valve 21 of the natural-cooling cold water device VII can be a two-way valve or a three-way valve, preferably a three-way valve. The electrically adjusting valve 21 can be installed on inlet or outlet pipes of the water-circulating natural-cooling heat exchange device 18, preferably on the outlet pipe.

The primary heat transfer medium 15 of the liquid cooling device II and the liquid cooling server 2 can be tap water, purified water, an organic solution, an inorganic solution, or Freon, preferably purified water.

The secondary heat transfer medium 16 of the natural-cooling cold water device VII is water or an antifreeze solution.

During operation of this system, heat generated by the chip 3 in the liquid cooling server 2 that accounts for 80% of the total heat is absorbed by the liquid heat dissipater 4, and is taken away by the primary heat transfer medium 15 flowing through the liquid heat dissipater 4 and having the temperature of about 35-45° C., keeping the temperature inside the server chip 3 of 60-70° C. to provide a normal operation status. Flow distribution and collection of the primary heat transfer medium 15 of the liquid heat dissipater 4 inside each liquid cooling server 2 are all accomplished by the liquid cooling device II. The primary heat transfer medium 15 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan 9 in the server itself or in the natural-cooling cold water device VII. Heat in the air flow is absorbed by the secondary heat transfer medium 16 flowing through the door-type cold water heat exchanger 8 of the natural-cooling cold water device VII and having the temperature of 15-20° C., allowing the air flow be cooled to about 20-25° C. again and then flow again into the server to take away heat generated by inner elements of the server, and so the cycle repeats.

In the circulation of the natural-cooling cold water device VII, the secondary heat transfer medium 16 inside the door-type cold water heat exchanger 8 having a temperature of 12-15° C. absorbs heat and becomes 17-20° C., and then flows into the chiller 14 and the water-circulating natural-cooling heat exchange device 18 under driving of circulating power of the pump 13 to be cooled to 12-17° C. again and then flows again into the door-type cold water heat exchanger 8, and so the cycle repeats.

In the external circulation of the natural-cooling cold water device VII, depending on different environment temperatures, there are two operation modes.

1) Mechanical cooling operation mode: when environment temperature is high (for example above 0° C.), the chiller 14 is activated, and the water-circulating natural-cooling heat exchange device 18 is stopped. The bypass of the electrically adjusting valve 21 is 0% opened, and the secondary heat transfer medium 16 does not flow through the water-circulating natural-cooling heat exchange device 18. The axial flow fan 149 is also stopped. All the cooling capacity of the secondary heat transfer medium 16 is provided by the chiller 14;

2) Natural-cooling operation mode: when environment temperature is low (for example below 0° C.), the chiller 14 is stopped, and the water-circulating natural-cooling heat exchange device 18 is activated. The bypass of the electrically adjusting valve 21 is firstly 100% opened, and all the secondary heat transfer medium 16 first flows through the water-circulating natural-cooling heat exchange device 18, and the cooling capacity generated by natural-cooling is adjusted by adjusting the rotation rate of the axial flow fan 19. When environment temperature is extremely low, the axial flow fan 19 is already working at its minimal rotation rate (generally 10-30%), however the cooling capacity generated by natural-cooling is still too high (the secondary heat transfer medium 16 is of a too below temperature), then the axial flow fan 19 is kept stably working at its minimal rotation rate, and the cooling capacity generated by natural-cooling is adjusted by adjusting the opening of the bypass of the electrically adjusting valve 21.

Example 4

As shown in FIG. 4, a server heat dissipation system is provided, comprising a liquid cooling server cabinet I, a liquid cooling device II, and a door-type heat pipe air conditioner IV. The liquid cooling server cabinet I comprises a cabinet body 1 and multiple liquid cooling servers 2 provided inside the cabinet body. The liquid cooling server 2 is provided with a server chip 3. The liquid cooling device II comprises a liquid heat dissipater 4, a distributor 6, and a collector 5. The distributor 6 and the collector 5 are respectively connected with the liquid heat dissipater 4 inside the liquid cooling server by a plurality of liquid inlet pipes 7 and a plurality of liquid outlet pipes 17. The liquid heat dissipater 4 contacts the server chips 3 or is provided adjacent to the server chips 3. The door-type heat pipe air conditioner IV comprises an evaporator 25 installed at a front door side or back door side of the cabinet body, a fan 9 installed at an air outlet side of the evaporator 25, an air pipe 27, a liquid pipe 26, a pump 13, a condenser 10 and a chiller 14. The evaporator 25 and the condenser 10 are respectively connected with the air pipe 27 and the liquid pipe 26 to form an internal circulation loop, and the condenser 10 is connected with the chiller 14 to form an external circulation loop. The pump is provided between the condenser 10 and the chiller 14.

The liquid cooling device II is externally installed on the cabinet body 1 fixedly.

The liquid inlet pipe 7 and the liquid outlet pipe 17 of the liquid cooling device II and the air pipe 27 and the liquid pipe 26 of the evaporator 25 are all soft pipes.

The fan 9 is an axial flow fan, The evaporator 25 is a heat exchanger with aluminum micro-channels. The evaporator 25 is installed at a back door side and can be opened by rotating around a shaft. The condenser 10 is a plate heat exchanger. The chiller 14 is a plate heat exchanger.

During operation of this system, heat generated by the chip 3 in the liquid cooling server 2 that accounts for 80% of the total heat is absorbed by the liquid heat dissipater 4, and is taken away by the primary heat transfer medium 15 flowing through the liquid heat dissipater 4 and having the temperature of about 35-45° C., keeping the temperature inside the server chip 3 of 60-70° C. to provide a normal operation status. Flow distribution and collection of the primary heat transfer medium 15 of the liquid heat dissipater 4 inside each liquid cooling server 2 are all accomplished by the liquid cooling device II. The primary heat transfer medium 15 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan in the server itself or the fan 9 in the door-type heat pipe air conditioner IV. Heat in the air flow is absorbed by the secondary heat transfer medium 16 flowing through the evaporator 25 of the door-type heat pipe air conditioner IV and having the temperature of 15-20° C., allowing the air flow be cooled to about 20-25° C. again and then flow again into the server to take away heat generated by inner elements of the server, and so the cycle repeats. The secondary heat transfer medium 16 in its liquid form inside the evaporator 25 absorbs heat and is evaporated into its gas form, which flows into the condenser 9 along the air pipe 27 under driving of circulating power in the heat pipe, where its heat is taken away by low temperature cold water provided by the chiller 14 and pump 13. The medium is condensed into its liquid form, and flows back into the evaporator 25 along the liquid pipe 26, and so the cycle repeats.

Example 5

Figure 5:
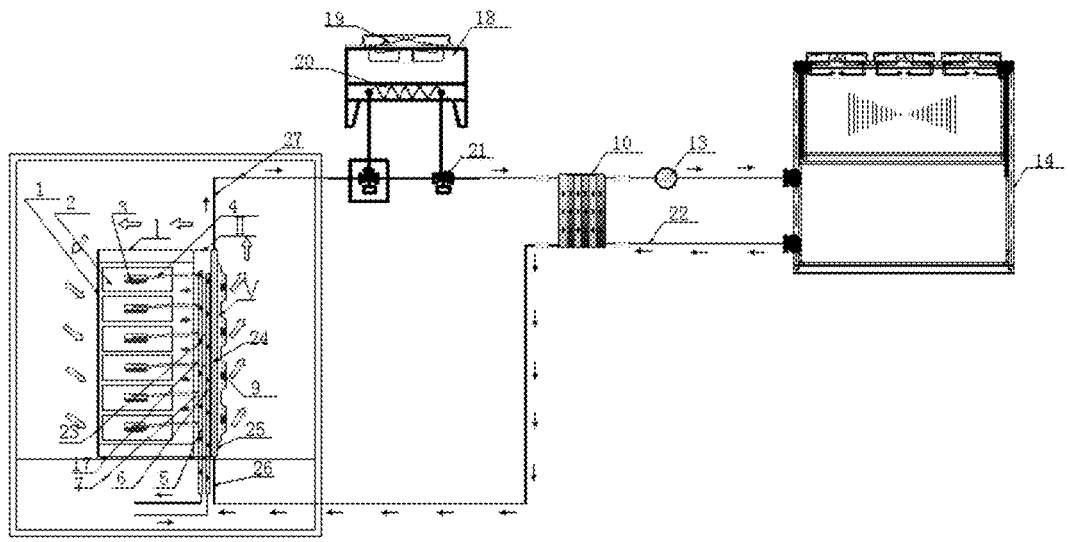

As shown in FIG. 5, a server heat dissipation system is provided, comprising a liquid cooling server cabinet I, a liquid cooling device II, and an air-cooling natural-cooling heat pipe air conditioner V. The liquid cooling server cabinet I comprises a cabinet body 1 and multiple liquid cooling servers 2 provided inside the cabinet body. The liquid cooling server 2 is provided with a server chip 3. The liquid cooling device I comprises a liquid heat dissipater 4, a distributor 6, and a collector 5. The distributor 6 and the collector 5 are respectively connected with the liquid heat dissipater 4 inside the liquid cooling server by a plurality of liquid inlet pipes 7 and a plurality of liquid outlet pipes 17. The liquid heat dissipater 4 contacts the server chips 3 or is provided adjacent to the server chips 3. The air-cooling natural-cooling heat pipe air conditioner V comprises an evaporator 25 installed at a back door side of the cabinet body 1, a fan 9 installed at an air outlet side of the evaporator 8, an air pipe 27, a liquid pipe 26, an air-cooling natural-cooling heat exchange device 18, an electrically adjusting valve 21, a pump 13, a condenser 10 and a chiller 14. The evaporator 25 and the condenser 10 are respectively connected with the air pipe 27 and the liquid pipe 26 to form an internal circulation loop. The air-cooling natural-cooling heat exchange device 18 and the electrically adjusting valve 21 are provided on the air pipe 27. The electrically adjusting valve 21 is provided on an inlet pipe of the air-cooling natural-cooling heat exchange device 18. The condenser 10 is connected with the chiller 14 to form an external circulation loop. The pump 13 is provided between the condenser 10 and the chiller 14.

Further, the water-circulating natural-cooling heat exchange device 18 comprises an axial flow fan 19 and a natural-cooling heat exchange coiled pipe 18. One end of the natural-cooling heat exchange coiled pipe 18 is arranged on the air pipe 27, and the other end connected with the electrically adjusting valve 21. The electrically adjusting valve 21 is a two-way valve or a three-way valve, preferably a three-way valve.

The liquid inlet pipe 7 and the liquid outlet pipe 17 of the liquid cooling device II and the air pipe 27 and the liquid pipe 26 of the evaporator 25 are all soft pipes. The liquid cooling device II is externally installed on the cabinet body 1 fixedly. The evaporator 25 can be opened by rotating around a shaft.

The liquid cooling heat transfer medium 23 of the liquid cooling device II and the liquid cooling server 2 is purified water. The internal circulation heat transfer medium 24 of the air-cooling natural-cooling heat pipe air conditioner V is R134a Freon. The external circulation heat transfer medium 22 is water, preferably antifreeze solution such as ethylene glycol solution in areas where the minimal temperature can be lower than 0° C.

During operation of this system, heat generated by the chip 3 in the liquid cooling server 2 that accounts for 80% of the total heat is absorbed by the liquid heat dissipater 4, and is taken away by the liquid cooling heat transfer medium 23 flowing through the liquid heat dissipater 4 and having the temperature of about 35-45° C., keeping the temperature inside the server chip 3 of 60-70° C. to provide a normal operation status. Flow distribution and collection of the liquid cooling heat transfer medium 23 of the liquid heat dissipater 4 inside each liquid cooling server 2 are all accomplished by the liquid cooling device II. The liquid cooling heat transfer medium 23 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan in the server itself or the fan 9 in the air-cooling natural-cooling heat pipe air conditioner V. Heat in the air flow is absorbed by the internal circulation heat transfer medium 24 flowing through the evaporator 25 of the air-cooling natural-cooling heat pipe air conditioner V and having the temperature of 15-20° C., allowing the air flow be cooled to about 20-25° C. again and then flow again into the server to take away heat generated by inner elements of the server, and so the cycle repeats.

In the inner circulation of the air-cooling natural-cooling heat pipe air conditioner V, the internal circulation heat transfer medium 24 in its liquid form inside the evaporator 25 absorbs heat and is evaporated into its gas form, which flows into the condenser 9 along the air pipe 27 under driving of circulating power in the heat pipe, where its heat is taken away by the external circulation heat transfer medium 22 of low temperature provided by the pump 13. The internal circulation heat transfer medium is condensed into its liquid form, which flows back into the evaporator 8 along the liquid pipe 26, and so the cycle repeats.

In the air-cooling natural-cooling heat pipe air conditioner V, depending on different environment temperatures, there are three operation modes.

1) Complete mechanical cooling operation mode: when environment temperature is high (for example above 20° C.), the chiller 14 is activated, and the air-cooling natural-cooling heat exchange device 18 is stopped. The bypass of the electrically adjusting valve 21 is 0% opened, and the internal circulation heat transfer medium 24 does not flow through the air-cooling natural-cooling heat exchange device 18. The axial flow fan 19 is also stopped. All the cooling capacity required by condensation of the internal circulation heat transfer medium 24 is provided by two heat transfer by the condenser 10 and the chiller 14;

2) Mixed cooling operation mode: when environment temperature is low (for example 0-20° C.), the chiller 14 and the air-cooling natural-cooling heat exchange device 18 are both activated. The bypass of the electrically adjusting valve 21 is 100% opened, and all the internal circulation heat transfer medium 24 first flows through the air-cooling natural-cooling heat exchange device 18, where the internal circulation heat transfer medium 24 is pre-cooled (partially condensed) by forced-convection heat transfer of the axial flow fan 19 and the natural-cooling heat exchange coiled pipe 20, and then flows through the condenser 10, where the remaining condensation heat is taken away by the external circulation heat transfer medium 22 of low temperature provided by the chiller 14 and the pump 13;

3) Complete natural-cooling operation mode: when environment temperature is low (for example below 0° C.), the chiller 14 is stopped, and the air-cooling natural-cooling heat exchange device 18 is activated. The bypass of the electrically adjusting valve 21 is firstly 100% opened, and all the internal circulation heat transfer medium 24 first flows through the air-cooling natural-cooling heat exchange device 18, and the cooling capacity generated by natural-cooling is adjusted by adjusting the rotation rate of the axial flow fan 19. When environment temperature is extremely low, the axial flow fan 19 is already working at its minimal rotation rate (generally 10-30%), however the cooling capacity generated by natural-cooling is still too high (the internal circulation heat transfer medium 24 is of a too low temperature and pressure), then the axial flow fan 19 is kept stably working at its minimal rotation rate, and the cooling capacity generated by natural-cooling is adjusted by adjusting the opening of the bypass of the electrically adjusting valve 21.

Example 6

Figure 6:
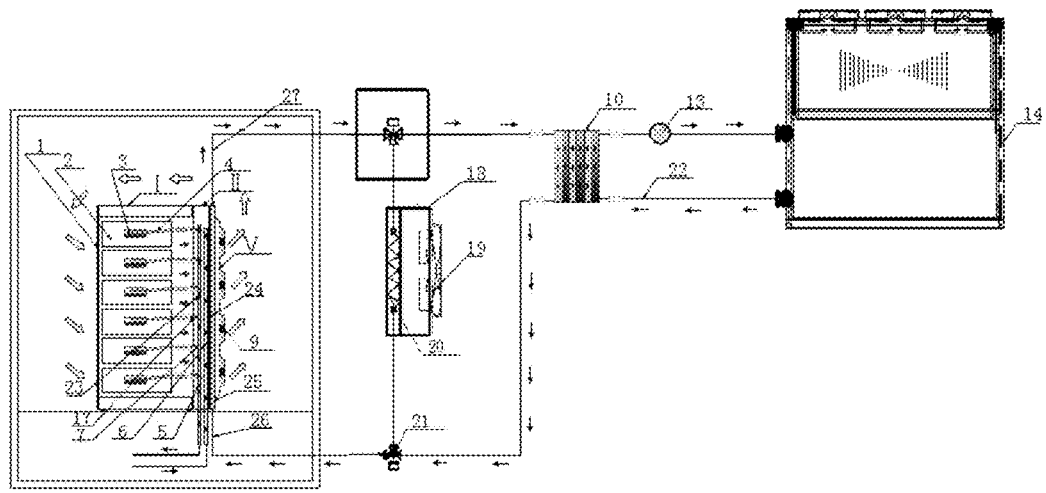

As shown in FIG. 6, a server heat dissipation system is provided, comprising a liquid cooling server cabinet I, a liquid cooling device II, and an air-cooling natural-cooling heat pipe air conditioner V. The liquid cooling server cabinet I comprises a cabinet body 1 and multiple liquid cooling servers 2 provided inside the cabinet body. The liquid cooling server 2 is provided with a server chip 3. The liquid cooling device II comprises a liquid heat dissipater 4, a distributor 6, and a collector 5. The distributor 6 and the collector 5 are respectively connected with the liquid heat dissipater 4 inside the liquid cooling server by a plurality of liquid inlet pipes 7 and a plurality of liquid outlet pipes 17. The liquid heat dissipater 4 contacts the server chips 3 or is provided adjacent to the server chips 3. The air-cooling natural-cooling heat pipe air conditioner V comprises an evaporator 25 installed at a back door side of the cabinet body, a fan 9 installed at an air outlet side of the evaporator 25, an air pipe 27, a liquid pipe 26, an air-cooling natural-cooling heat exchange device 18, an electrically adjusting valve 21, a pump 13, a condenser 10 and a chiller 14. The evaporator 25 and the condenser 10 are respectively connected with the air pipe 27 and the liquid pipe 26 to form an internal circulation loop. One end of the air-cooling natural-cooling heat exchange device 18 is arranged on the air pipe 27, and the other end arranged on the liquid pipe 26. The electrically adjusting valve 21 is provided on an outlet pipe of the air-cooling natural-cooling heat exchange device 18. The condenser 10 is connected with the chiller 14 to form an external circulation loop. The pump 13 is provided between the condenser 10 and the chiller 14.

Further, the water-circulating natural-cooling heat exchange device 18 comprises an axial flow fan 19 and a natural-cooling heat exchange coiled pipe 18. One end of the natural-cooling heat exchange coiled pipe 18 is arranged on the air pipe 27, and the other end connected with the electrically adjusting valve 21. The electrically adjusting valve 21 is a three-way valve.

The liquid inlet pipe 7 and the liquid outlet pipe 17 of the liquid cooling device II and the air pipe 27 and the liquid pipe 26 of the evaporator 25 are all soft pipes. The liquid cooling device II is externally installed on the cabinet body 1 fixedly. The evaporator 25 can be opened by rotating around a shaft.

The liquid cooling heat transfer medium 23 of the liquid cooling device II and the liquid cooling server 2 is purified water. The internal circulation heat transfer medium 24 of the air-cooling natural-cooling heat pipe air conditioner V is R134a Freon. The external circulation heat transfer medium 22 is water, preferably antifreeze solution such as ethylene glycol solution in areas where the minimal temperature can be lower than 0° C.

During operation of this system, heat generated by the chip 3 in the liquid cooling server 2 that accounts for 80% of the total heat is absorbed by the liquid heat dissipater 4, and is taken away by the liquid cooling heat transfer medium 23 flowing through the liquid heat dissipater 4 and having the temperature of about 35-45° C., keeping the temperature inside the server chip 3 of 60-70° C. to provide a normal operation status. Flow distribution and collection of the liquid cooling heat transfer medium 23 of the liquid heat dissipater 4 inside each liquid cooling server 2 are all accomplished by the liquid cooling device II. The liquid cooling heat transfer medium 23 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan in the server itself or the fan 9 in the air-cooling natural-cooling heat pipe air conditioner V. Heat in the air flow is absorbed by the internal circulation heat transfer medium 24 flowing through the evaporator 25 of the air-cooling natural-cooling heat pipe air conditioner V and having the temperature of 15-20° C., allowing the air flow be cooled to about 20-25° C. again and then flow again into the server to take away heat generated by inner elements of the server, and so the cycle repeats.

In the inner circulation of the air-cooling natural-cooling heat pipe air conditioner V, the internal circulation heat transfer medium 24 in its liquid form inside the evaporator 25 absorbs heat and is evaporated into its gas form, which flows into the condenser 9 along the air pipe 27 under driving of circulating power in the heat pipe, where its heat is taken away by the external circulation heat transfer medium 22 of low temperature provided by the pump 13. The internal circulation heat transfer medium is condensed into its liquid form, which flows back into the evaporator 8 along the liquid pipe 26, and so the cycle repeats.

In the air-cooling natural-cooling heat pipe air conditioner V, depending on different environment temperatures, there are two operation modes.

1) Mechanical cooling operation mode: when environment temperature is high (for example above 0° C.), the chiller 14 is activated, and the air-cooling natural-cooling heat exchange device 18 is stopped. The bypass of the electrically adjusting valve 21 is 0% opened, and the internal circulation heat transfer medium 24 does not flow through the air-cooling natural-cooling heat exchange device 18. The axial flow fan 19 is also stopped. All the cooling capacity required by condensation of the internal circulation heat transfer medium 24 is provided by two heat transfer by the condenser 10 and the chiller 14;

2) Natural-cooling operation mode: when environment temperature is low (for example below 0° C.), the chiller 14 is stopped, and the air-cooling natural-cooling heat exchange device 18 is activated. The bypass of the electrically adjusting valve 21 is firstly 100% opened, and all the internal circulation heat transfer medium 24 first flows through the air-cooling natural-cooling heat exchange device 18, and the cooling capacity generated by natural-cooling is adjusted by adjusting the rotation rate of the axial flow fan 19. When environment temperature is extremely low, the axial flow fan 19 is already working at its minimal rotation rate (generally 10-30%), however the cooling capacity generated by natural-cooling is still too high (the internal circulation heat transfer medium 24 is of a too low temperature and pressure), then the axial flow fan 19 is kept stably working at its minimal rotation rate, and the cooling capacity generated by natural-cooling is adjusted by adjusting the opening of the bypass of the electrically adjusting valve 21.

Example 7

Figure 7:
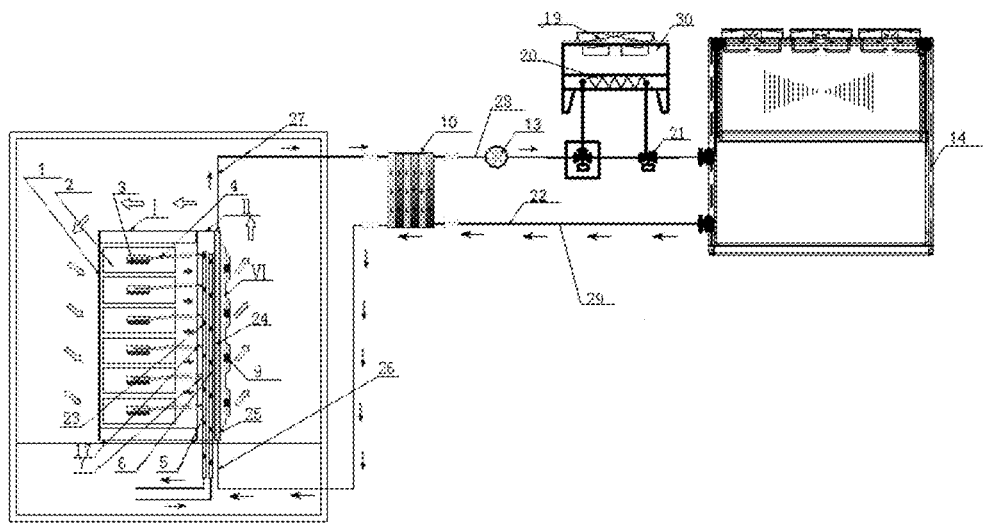

As shown in FIG. 7, a server heat dissipation system is provided, comprising a liquid cooling server cabinet I, a liquid cooling device II, and a water-circulating natural-cooling heat pipe air conditioner VI. The liquid cooling server cabinet I comprises a cabinet body 1 and multiple liquid cooling servers 2 provided inside the cabinet body. The liquid cooling server 2 is provided with a server chip 3. The liquid cooling device II comprises a liquid heat dissipater 4, a distributor 6, and a collector 5. The distributor 6 and the collector 5 are respectively connected with the liquid heat dissipater 4 inside the liquid cooling server by a plurality of liquid inlet pipes 7 and a plurality of liquid outlet pipes 17. The liquid heat dissipater 4 contacts the server chips 3 or is provided adjacent to the server chips 3. The water-circulating natural-cooling heat pipe air conditioner VI comprises an evaporator 25 installed at a front or back door side of the cabinet body 1, a fan 9 installed at an air outlet side of the evaporator 25, an air pipe 27, a liquid pipe 26, a liquid inlet pipe 28, a liquid outlet pipe 29, a water-circulating natural-cooling heat exchange device 30, an electrically adjusting valve 21, a pump 13, a condenser 10 and a chiller 14. The evaporator 25 and the condenser 10 are respectively connected with the air pipe 27 and the liquid pipe 26 to form an internal circulation loop. The condenser 10 and the chiller 14 are respectively connected with the liquid inlet pipe 28 and the liquid outlet pipe 29 to form an external circulation loop. The pump 13 and the water-circulating natural-cooling heat exchange device 30 are connected in series on the liquid inlet pipe 28. The electrically adjusting valve 21 is provided on an inlet or outlet pipe of the water-circulating natural-cooling heat exchange device 30.

Further, the water-circulating natural-cooling heat exchange device 30 comprises an axial flow fan 19 and a natural-cooling heat exchange coiled pipe 20. One end of the natural-cooling heat exchange coiled pipe 20 is arranged on the air pipe 27, and the other end connected with the electrically adjusting valve 21. The electrically adjusting valve 21 is a three-way valve.

The liquid inlet pipe 7 and the liquid outlet pipe 17 of the liquid cooling device II and the air pipe 27 and the liquid pipe 26 of the evaporator 25 are all soft pipes. The liquid cooling device II is externally installed on the cabinet body 1 fixedly. The evaporator 25 can be opened by rotating around a shaft.

The liquid cooling heat transfer medium 23 of the liquid cooling device II and the liquid cooling server 2 is purified water. The internal circulation heat transfer medium 24 of the water-circulating natural-cooling heat pipe air conditioner VI is R134a Freon. The external circulation heat transfer medium 22 is water, preferably antifreeze solution such as ethylene glycol solution in areas where the minimal temperature can be lower than 0° C.

During operation of this system, heat generated by the chip 3 in the liquid cooling server 2 that accounts for 80% of the total heat is absorbed by the liquid heat dissipater 4, and is taken away by the liquid cooling heat transfer medium 23 flowing through the liquid heat dissipater 4 and having the temperature of about 35-45° C., keeping the temperature inside the server chip 3 of 60-70° C. to provide a normal operation status. Flow distribution and collection of the liquid cooling heat transfer medium 23 of the liquid heat dissipater 4 inside each liquid cooling server 2 are all accomplished by the liquid cooling device II. The liquid cooling heat transfer medium 23 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan in the server itself or the fan 9 in the water-circulating natural-cooling heat pipe air conditioner VI. Heat in the air flow is absorbed by the internal circulation heat transfer medium 24 flowing through the evaporator 25 of the water-circulating natural-cooling heat pipe air conditioner VI and having the temperature of 15-20° C., allowing the air flow be cooled to about 20-25° C. again and then flow again into the server to take away heat generated by inner elements of the server, and so the cycle repeats.

In the inner circulation of the water-circulating natural-cooling heat pipe air conditioner VI, the internal circulation heat transfer medium 24 in its liquid form inside the evaporator 25 absorbs heat and is evaporated into its gas form, which flows into the condenser 9 along the air pipe 27 under driving of circulating power in the heat pipe, where its heat is taken away by the external circulation heat transfer medium 22 of low temperature provided by the pump 13. The internal circulation heat transfer medium is condensed into its liquid form, which flows back into the evaporator 25 along the liquid pipe 26, and so the cycle repeats.

In outer circulation of the water-circulating natural-cooling heat pipe air conditioner VI, depending on different environment temperatures, there are three operation modes.

1) Complete mechanical cooling operation mode: when environment temperature is high (for example above 20° C.), the chiller 14 is activated, and the water-circulating natural-cooling heat exchange device 30 is stopped. The bypass of the electrically adjusting valve 21 is 0% opened, and the external circulation heat transfer medium 22 does not flow through the water-circulating natural-cooling heat exchange device 30. The axial flow fan 19 is also stopped. All the cooling capacity of the external circulation heat transfer medium 22 is provided by the chiller 14;

2) Mixed cooling operation mode: when environment temperature is low (for example 0-20° C.), the chiller 14 and the water-circulating natural-cooling heat exchange device 30 are both activated. The bypass of the electrically adjusting valve 21 is 100% opened, and all the external circulation heat transfer medium 22 first flows through the water-circulating natural-cooling heat exchange device 30, where the external circulation heat transfer medium 22 is pre-cooled by forced-convection heat transfer of the axial flow fan 19 and the natural-cooling heat exchange coiled pipe 20, and then flows through the chiller 14 to perform compensated cooling to reach the required temperature;

3) Complete natural-cooling operation mode: when environment temperature is low (for example below 0° C.), the chiller 14 is stopped, and the water-circulating natural-cooling heat exchange device 30 is activated. The bypass of the electrically adjusting valve 21 is firstly 100% opened, and all the secondary heat transfer medium first 22 flows through the water-circulating natural-cooling heat exchange device 18, and the cooling capacity generated by natural-cooling is adjusted by adjusting the rotation rate of the axial flow fan 19. When environment temperature is extremely low, the axial flow fan 19 is already working at its minimal rotation rate (generally 10-30%), however the cooling capacity generated by natural-cooling is still too high (the secondary heat transfer medium 22 is of a too low temperature), then the axial flow fan 19 is kept stably working at its minimal rotation rate, and the cooling capacity generated by natural-cooling is adjusted by adjusting the opening of the bypass of the electrically adjusting valve 21.

Example 8

Figure 8:
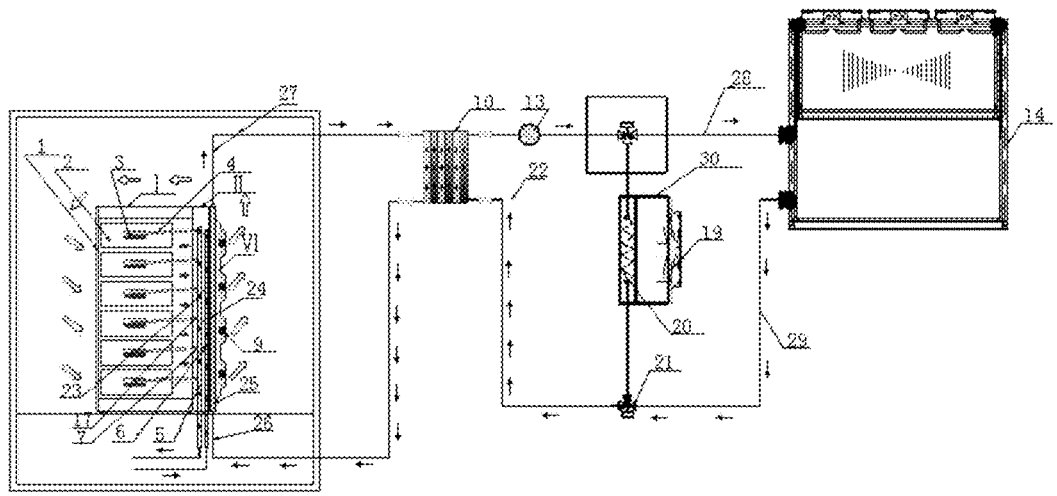

As shown in FIG. 8, a server heat dissipation system is provided, comprising a liquid cooling server cabinet I, a liquid cooling device II, and a water-circulating natural-cooling heat pipe air conditioner VI. The liquid cooling server cabinet I comprises a cabinet body 1 and multiple liquid cooling servers 2 provided inside the cabinet body. The liquid cooling server 2 is provided with a server chip 3. The liquid cooling device II comprises a liquid heat dissipater 4, a distributor 6, and a collector 5. The distributor 6 and the collector 5 are respectively connected with the liquid heat dissipater 4 inside the liquid cooling server by a plurality of liquid inlet pipes 7 and a plurality of liquid outlet pipes 17. The liquid heat dissipater 4 contacts the server chips 3 or is provided adjacent to the server chips 3. The water-circulating natural-cooling heat pipe air conditioner VI comprises an evaporator 25 installed at a back door side of the cabinet body 1, a fan 9 installed at an air outlet side of the evaporator 25, an air pipe 27, a liquid pipe 26, a liquid inlet pipe 28, a liquid outlet pipe 29, a water-circulating natural-cooling heat exchange device 30, an electrically adjusting valve 21, a pump 13, a condenser 10 and a chiller 14. The evaporator 25 and the condenser 10 are respectively connected with the air pipe 27 and the liquid pipe 26 to form an internal circulation loop. The condenser 10 and the chiller 14 are respectively connected with the liquid inlet pipe 28 and the liquid outlet pipe 29 to form an external circulation loop. One end of the water-circulating natural-cooling heat exchange device 30 is arranged on the liquid inlet pipe 28, and the other end arranged on the liquid outlet pipe 29. The electrically adjusting valve 21 is provided on an outlet pipe of the water-circulating natural-cooling heat exchange device 30. The pump 13 is further provided on the inlet pipe of the water-circulating natural-cooling heat exchange device 30.

Further, the water-circulating natural-cooling heat exchange device 30 comprises an axial flow fan 19 and a natural-cooling heat exchange coiled pipe 20. One end of the natural-cooling heat exchange coiled pipe 20 is arranged on the air pipe 27, and the other end connected with the electrically adjusting valve 21. The electrically adjusting valve 21 is a three-way valve.

The liquid inlet pipe 7 and the liquid outlet pipe 17 of the liquid cooling device II and the air pipe 27 and the liquid pipe 26 of the evaporator 25 are all soft pipes. The liquid cooling device II is externally installed on the cabinet body 1 fixedly. The evaporator 25 can be opened by rotating around a shaft.

The liquid cooling heat transfer medium 23 of the liquid cooling device II and the liquid cooling server 2 is purified water. The internal circulation heat transfer medium 24 of the air-cooling natural-cooling heat pipe air conditioner III is R134a Freon. The external circulation heat transfer medium 22 is water, preferably antifreeze solution such as ethylene glycol solution in areas where the minimal temperature can be lower than 0° C.

During operation of this system, heat generated by the chip 3 in the liquid cooling server 2 that accounts for 80% of the total heat is absorbed by the liquid heat dissipater 4, and is taken away by the liquid cooling heat transfer medium 23 flowing through the liquid heat dissipater 4 and having the temperature of about 35-45° C., keeping the temperature inside the server chip 3 of 60-70° C. to provide a normal operation status. Flow distribution and collection of the liquid cooling heat transfer medium 23 of the liquid heat dissipater 4 inside each liquid cooling server 2 are all accomplished by the liquid cooling device U. The liquid cooling heat transfer medium 23 having the temperature of about 35-45° C. flows from a liquid supplying main pipe into the distributor 6, and then flows into the liquid heat dissipater 4 by the liquid inlet pipe 7 to absorb heat of the server chip 3, after which it becomes 40-50° C. and then flows into the collector 5 by the liquid outlet pipes 17, and flows back to a liquid collecting main pipe.

Heat generated by other elements in the liquid cooling server 2 that accounts for about 20% of the total heat is taken away by air flow generated by the fan in the server itself or the fan 9 in the water-circulating natural-cooling heat pipe air conditioner VI. Heat in the air flow is absorbed by the internal circulation heat transfer medium 24 flowing through the evaporator 25 of the water-circulating natural-cooling heat pipe air conditioner VI and having the temperature of 15-20° C., allowing the air flow be cooled to about 20-25° C. again and then flow again into the server to take away heat generated by inner elements of the server, and so the cycle repeats.

In the inner circulation of the water-circulating natural-cooling heat pipe air conditioner VI, the internal circulation heat transfer medium 24 in its liquid form inside the evaporator 25 absorbs heat and is evaporated into its gas form, which flows into the condenser 9 along the air pipe 27 under driving of circulating power in the heat pipe, where its heat is taken away by the external circulation heat transfer medium 22 of low temperature provided by the pump 13. The internal circulation heat transfer medium is condensed into its liquid form, which flows back into the evaporator 25 along the liquid pipe 26, and so the cycle repeats.

In outer circulation of the water-circulating natural-cooling heat pipe air conditioner VI, depending on different environment temperatures, there are two operation modes.

1) Mechanical cooling operation mode: when environment temperature is high (for example above 0° C.), the chiller 14 is activated, and the water-circulating natural-cooling heat exchange device 30 is stopped. The bypass of the electrically adjusting valve 21 is 0% opened, and the external circulation heat transfer medium 22 does not flow through the water-circulating natural-cooling heat exchange device 30. The axial flow fan 19 is also stopped. All the cooling capacity of the external circulation heat transfer medium 22 is provided by the chiller 14;

2) Natural-cooling operation mode: when environment temperature is low (for example below 0° C.), the chiller 14 is stopped, and the water-circulating natural-cooling heat exchange device 30 is activated. The bypass of the electrically adjusting valve 21 is firstly 100% opened, and all the secondary heat transfer medium first 22 flows through the water-circulating natural-cooling heat exchange device 30, and the cooling capacity generated by natural-cooling is adjusted by adjusting the rotation rate of the axial flow fan 19. When environment temperature is extremely low, the axial flow fan 19 is already working at its minimal rotation rate (generally 10-30%), however the cooling capacity generated by natural-cooling is still too high (the secondary heat transfer medium 22 is of a too low temperature), then the axial flow fan 19 is kept stably working at its minimal rotation rate, and the cooling capacity generated by natural-cooling is adjusted by adjusting the opening of the bypass of the electrically adjusting valve 21.

Example 9

Figure 9:
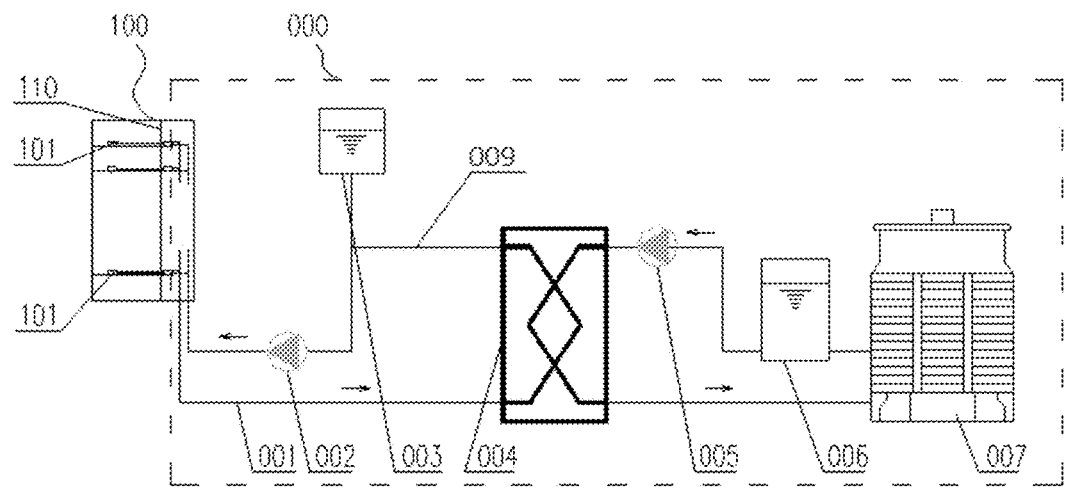
FIG. 9 is a schematic view showing the liquid cooling system of Examples 9 and 10.

As shown in FIG. 9, a server cabinet heat dissipation system is provided, comprising a server cabinet 100. The server cabinet 100 comprises a cabinet body and multiple servers provided inside the cabinet body. The server is provided with a server chip. It is provided with a liquid cooling device 000 to perform direct liquid cooling to the servers, and with an air-cooling inter-row air conditioner 008 to perform auxiliary heat dissipation.

Further, the liquid cooling device 000 comprises an internal circulation system and an external circulation system. The internal circulation system comprises a liquid heat transfer pipe 101 provided inside the server, a plate heat exchanger 004, an internal circulation inlet pipe 009, and an internal circulation outlet pipe 001. The plate heat exchanger 004 is connected with the liquid heat transfer pipe 101 by the internal circulation inlet pipe 009 and the internal circulation outlet pipe 001 to form a circulation loop. A pressure stabilizing liquid supplying device 003 and a first circulating liquid pump 002 are further provided on the internal circulation inlet pipe 009. The external circulation system is a circulation loop formed by successively connecting a cold liquid tower 007, a liquid tank 006, a second circulating liquid pump 005, and the plate heat exchanger 004.

The liquid heat transfer pipe 101 is a heat pipe component, with one end directly contacting the server chips to transfer heat, and the other end integrated in the internal circulation system to exchange heat. Multiple liquid heat transfer pipes 101 are connected in parallel in the internal circulation system. The liquid heat transfer pipe of the server is filled with refrigerant which is in a gas-liquid two-phase status at normal temperature and pressure, with one end directly contacting the server chips to transfer heat, and the other end exchanging heat with a liquid coolant in the internal circulation system. Since various electronic components are installed inside the server, in order to prevent circulation system liquid from leaking to the electronic components, a liquid blocking plate 110 is provided in the server cabinet 100, for protection and isolation to two ends of the liquid heat transfer pipe 101 in each server. During operation, natural-convection heat transfer is performed by circulating of the coolant in the internal circulation system, continuously spreading the heat generated by the server chips into the environment. Between the server chips and the outer liquid cooling device, a heat pipe heat exchange component is used to perform intermediate cooling, which can prevent liquid from directly going inside the server, thereby reducing possibility of server damaging due to liquid system leakage.

The first or second circulating liquid pump 002, 005 is a variable frequency pump. Fluid flow in the power driving pipe is provided by the first or second circulating liquid pump 002, 005.

During operation, the heat transferred from the server chips to the liquid heat transfer pipe 101 is taken away by the internal circulation system, and the heat absorbed by the external circulation system is taken away by the external circulation system.

Figure 10:
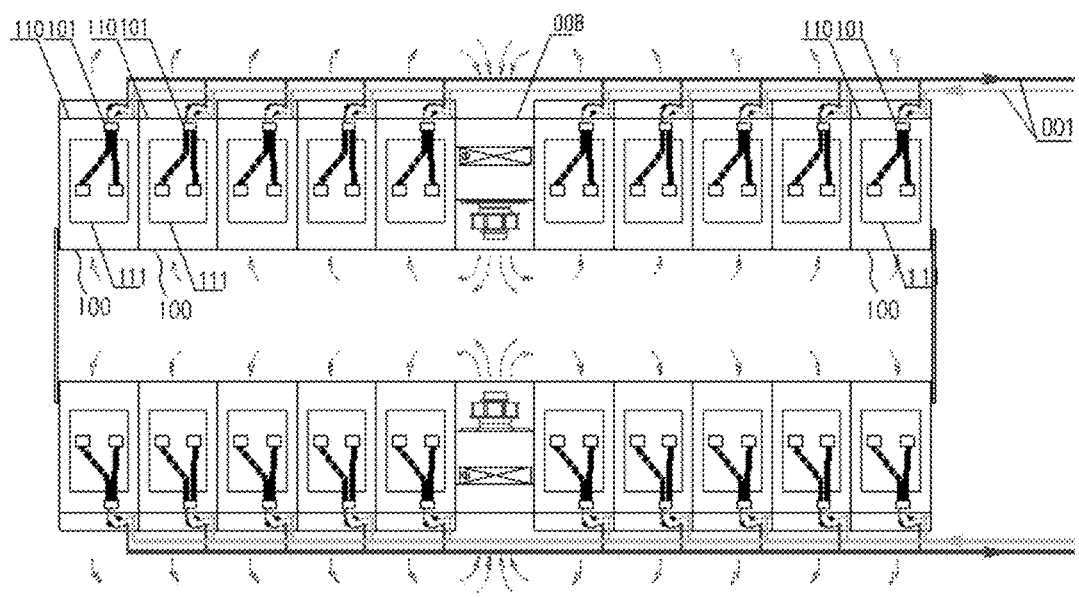
FIG. 10 is a top view of Example 9.

As shown in FIG. 10, two air-cooling inter-row air conditioners 008 are installed in parallel to the server cabinet 100. Multiple servers 111 are installed side by side in the server cabinet 100. Two server cabinets 100 are installed facing each other to form a cold passage in the middle. Correspondingly, a hot passage is formed at the side where two server cabinets 100 are not facing each other. Air is supplied to the cold passage and then returned from the hot passage by the air-cooling inter-row air conditioners 008. Air is cooled by the inter-row air conditioner 008, and remaining heat of the server 111 is taken away by the air of low temperature. Humidity of the computer room can be adjusted by heating and humidifying function of the air-cooling inter-row air conditioners 008.

Example 10

As shown in FIG. 9, a server cabinet heat dissipation system is provided, comprising a server cabinet 100. The server cabinet 100 comprises a cabinet body and multiple servers provided inside the cabinet body. The server is provided with a server chip. It is provided with a liquid cooling device 000 to perform direct liquid cooling to the servers, and with an air-cooling inter-row air conditioner 008 to perform auxiliary heat dissipation.

Further, the liquid cooling device 000 comprises an internal circulation system and an external circulation system. The internal circulation system comprises a liquid heat transfer pipe 101 provided inside the server, a plate heat exchanger 004, an internal circulation inlet pipe 009, and an internal circulation outlet pipe 001. The plate heat exchanger 004 is connected with the liquid heat transfer pipe 101 by the internal circulation inlet pipe 009 and the internal circulation outlet pipe 001 to form a circulation loop. A pressure stabilizing liquid supplying device 003 and a first circulating liquid pump 002 are further provided on the internal circulation inlet pipe 009. The external circulation system is a circulation loop formed by successively connecting a cold liquid tower 007, a liquid tank 006, a second circulating liquid pump 005, and the plate heat exchanger 004.

The liquid heat transfer pipe 101 is a heat pipe component, with one end directly contacting the server chips to transfer heat, and the other end integrated in the internal circulation system to exchange heat. Multiple liquid heat transfer pipes 101 are connected in parallel in the internal circulation system. The liquid heat transfer pipe of the server is filled with refrigerant which is a gas at normal temperature and pressure, with one end directly contacting the server chips to transfer heat, and the other end exchanging heat with a liquid coolant in the internal circulation system. Since various electronic components are installed inside the server, in order to prevent circulation system liquid from leaking to the electronic components, a liquid blocking plate 110 is provided in the server cabinet 100, for protection and isolation to two ends of the liquid heat transfer pipe 101 in each server. During operation, natural-convection heat transfer is performed by circulating of the coolant in the internal circulation system, continuously spreading the heat generated by the server chips into the environment. Between the server chips and the outer liquid cooling device, a heat pipe heat exchange component is used to perform intermediate cooling, which can prevent liquid from directly going inside the server, thereby reducing possibility of server damaging due to liquid system leakage.

The first or second circulating liquid pump 002, 005 is a variable frequency pump. Fluid flow in the power driving pipe is provided by the first or second circulating liquid pump 002, 005.

During operation, the heat transferred from the server chips to the liquid heat transfer pipe 101 is taken away by the internal circulation system, and the heat absorbed by the external circulation system is taken away by the external circulation system.

Figure 11:
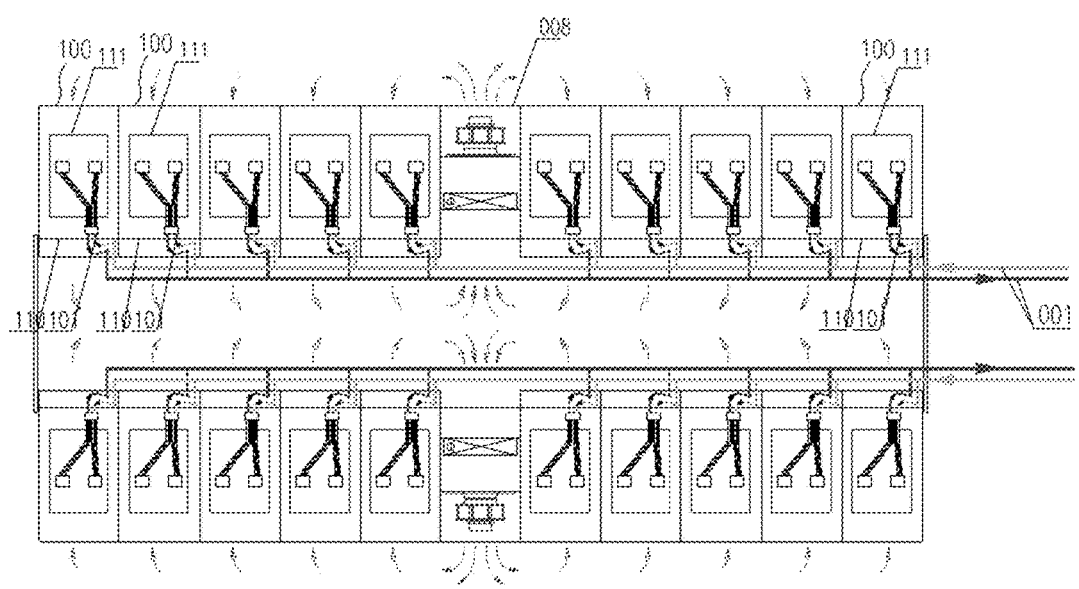

As shown in FIG. 11, two air-cooling inter-row air conditioners 008 are installed in parallel to the server cabinet 100. Multiple servers 111 are installed side by side in the server cabinet 100. Two server cabinets 100 are installed facing each other to form a hot passage in the middle. Correspondingly, a cold passage is formed at the side where two server cabinets 100 are not facing each other. Air is supplied to the cold passage and then returned from the hot passage by the air-cooling inter-row air conditioners 008. Air is cooled by the inter-row air conditioner 008, and remaining heat of the server 111 is taken away by the air of low temperature. Humidity of the computer room can be adjusted by heating and humidifying function of the air-cooling inter-row air conditioners 008.

The invention claimed is:

1. A server heat dissipation system, comprising:
   a liquid cooling server cabinet comprising:
      a cabinet body; and
      multiple liquid cooling servers provided inside the cabinet body;
   a liquid cooling device to perform direct liquid cooling to the liquid cooling servers, the liquid cooling device being disposed along an exterior of the cabinet body and comprising:
      a distributor;
      a collector;
      an internal circulation system;
      an external circulation system; and
      a branch pipe, the branch pipe connecting the distributor and the collector to the multiple cooling servers; and
   an auxiliary heat dissipation device to perform auxiliary heat dissipation to the liquid cooling servers, the auxiliary heat dissipation device comprising a door-type cold water heat exchange device or a heat pipe air conditioner, the auxiliary heat dissipation device being connected in parallel on the internal circulation system and the external circulation system.

2. The server heat dissipation system of claim 1, wherein the liquid cooling device further comprises a liquid heat dissipater and a primary heat transfer medium, and
   wherein the liquid heat dissipater is provided for performing heat dissipation to server chips, the distributor is connected with the liquid heat dissipater by a plurality of liquid inlet pipes, the liquid heat dissipater is then connected with the collector by a plurality of liquid outlet pipes, the primary heat transfer medium flows into the liquid heat dissipater through the distributor and the liquid inlet pipes, and then flows out from the liquid heat dissipater through the liquid outlet pipes, and then is collected by the collector.

3. The server heat dissipation system of claim 2, wherein the liquid heat dissipater is provided adjacent to the server chips, or in direct connection with the server chips.

4. The server heat dissipation system of claim 1, wherein the auxiliary heat dissipation device is a door-type cold water heat exchange device comprising a cold water heat exchanger, a connecting pipe, and a secondary heat transfer medium, and
   wherein the cold water heat exchanger is arranged on the liquid cooling server cabinet or the liquid cooling device, and the secondary heat transfer medium is carried by the connecting pipe.

5. The server heat dissipation system of claim 4, wherein the door-type cold water heat exchange device further comprises a chiller, a pump, and a fan, and
   wherein the chiller and the pump are arranged outside room and connected with the cold water heat exchanger by the connecting pipe, and the fan is installed at an air outlet side of the cold water heat exchanger.

6. The server heat dissipation system of claim 5, wherein a water-circulating natural-cooling heat exchange device and an electrically adjusting valve are provided on either the connecting pipe or the circulating pipe,
   wherein the water-circulating natural-cooling heat exchange device comprises an axial flow fan and a natural-cooling heat exchange coiled pipe, the natural-cooling heat exchange coiled pipe is connected in series or parallel on either the connecting pipe or the circulating pipe, and
   wherein the electrically adjusting valve is proved at a water outlet of the water-circulating natural-cooling heat exchange device.

7. The server heat dissipation system of claim 1, wherein the internal circulation system comprises a liquid heat transfer pipe provided inside the server, an intermediate heat exchanger, an internal circulation inlet pipe, and an internal circulation outlet pipe, the intermediate heat exchanger is connected with the liquid heat transfer pipe by the internal circulation inlet pipe and the internal circulation outlet pipe to form a circulation loop,
   wherein the external circulation system is a circulation loop formed by successively connecting a cold liquid tower, a liquid tank, a circulating liquid pump, and the intermediate heat exchanger, and
   wherein heat transfer between the internal circulation system and the external circulation system is provided by the intermediate heat exchanger.

8. The server heat dissipation system of claim 1, wherein the auxiliary heat dissipation device is a heat pipe air conditioner comprising an evaporator, a condenser, a connecting pipe, and a secondary heat transfer medium, and
   wherein the evaporator is connected with the condenser by the connecting pipe to form a circulation loop, and the secondary heat transfer medium is carried by the connecting pipe.

9. The server heat dissipation system of claim 8, wherein the heat pipe air conditioner further comprises a chiller provided outside the cabinet, the chiller is connected with the condenser by a circulating pipe to form a circulation loop, and a pump is provided on the circulating pipe.

10. The server heat dissipation system of claim 9, wherein a water-circulating natural-cooling heat exchange device and an electrically adjusting valve are provided on either the connecting pipe or the circulating pipe,
- wherein the water-circulating natural-cooling heat exchange device comprises an axial flow fan and a natural-cooling heat exchange coiled pipe, the natural-cooling heat exchange coiled pipe is connected in series or parallel on either the connecting pipe or the circulating pipe, and
- wherein the electrically adjusting valve is proved at a water outlet of the water-circulating natural-cooling heat exchange device.

11. The server heat dissipation system of claim 1, wherein the auxiliary heat dissipation device is one or more air-cooling inter-row air conditioners and is installed in parallel to the server cabinet, multiple servers are installed side by side in the server cabinet, adjacent server cabinets are installed facing each other to form alternating cold passage and hot passage, and air is supplied to the cold passage and then returned from the hot passage by the air-cooling inter-row air conditioners.

\* \* \* \* \*